(12) United States Patent
Angel et al.

(10) Patent No.: US 8,082,755 B2
(45) Date of Patent: Dec. 27, 2011

(54) METHOD OF MANUFACTURING LARGE DISH REFLECTORS FOR A SOLAR CONCENTRATOR APPARATUS

(75) Inventors: Roger P Angel, Tucson, AZ (US); Blain H Olbert, Tucson, AZ (US)

(73) Assignee: Arizona Board of Regents, Tucson, AZ (US)

( * ) Notice: Subject to any disclaimer, the term of this patent is extended or adjusted under 35 U.S.C. 154(b) by 412 days.

(21) Appl. No.: 12/463,026

(22) Filed: May 8, 2009

(65) Prior Publication Data

US 2009/0277224 A1 Nov. 12, 2009

Related U.S. Application Data

(60) Provisional application No. 61/127,298, filed on May 12, 2008.

(51) Int. Cl.
*C03B 23/025* (2006.01)

(52) U.S. Cl. ............ 65/60.1; 65/60.4; 65/25.1; 65/107; 65/94

(58) Field of Classification Search .............. 65/25.1, 65/60.1, 60.4, 107, 94
See application file for complete search history.

(56) References Cited

U.S. PATENT DOCUMENTS

| | | | |
|---|---|---|---|
| 3,552,941 A | | 1/1971 | Giffen |
| 3,756,797 A | * | 9/1973 | Akeyoshi ................. 65/25.4 |
| 4,088,470 A | * | 5/1978 | Bourg et al. ................. 65/105 |
| 4,313,746 A | * | 2/1982 | Juras ................. 65/25.4 |
| 4,436,373 A | * | 3/1984 | Kirsch ................. 359/853 |
| 4,525,196 A | * | 6/1985 | Fecik et al. ................. 65/287 |
| 5,118,543 A | * | 6/1992 | McColl ................. 428/34 |

(Continued)

FOREIGN PATENT DOCUMENTS

DE 3104690 8/1982

(Continued)

OTHER PUBLICATIONS

Reply to EPO Communication Pursuant to Rules 161(1) and 162 EPC from related EPC Application No. 09 747 260.9, based on PCT/US2009/043378.

(Continued)

*Primary Examiner* — John Hoffmann
(74) *Attorney, Agent, or Firm* — Snell & Wilmer L.L.P.

(57) ABSTRACT

A method of manufacturing monolithic glass reflectors for concentrating sunlight in a solar energy system is disclosed. The method of manufacturing allows large monolithic glass reflectors to be made from float glass in order to realize significant cost savings on the total system cost for a solar energy system. The method of manufacture includes steps of heating a sheet of float glass positioned over a concave mold until the sheet of glass sags and stretches to conform to the shape of the mold. The edges of the dish-shaped glass are rolled for structural stiffening around the periphery. The dish-shaped glass is then silvered to create a dish-shaped mirror that reflects solar radiation to a focus. The surface of the mold that contacts the float glass preferably has a grooved surface profile comprising a plurality of cusps and concave valleys. This grooved profile minimizes the contact area and marring of the specular glass surface, reduces parasitic heat transfer into the mold and increases mold lifetime. The disclosed method of manufacture is capable of high production rates sufficiently fast to accommodate the output of a conventional float glass production line so that monolithic glass reflectors can be produced as quickly as a float glass production can make sheets of float glass to be used in the process.

9 Claims, 30 Drawing Sheets

U.S. PATENT DOCUMENTS

| | | | | |
|---|---|---|---|---|
| 5,129,934 | A * | 7/1992 | Koss | 65/107 |
| 5,147,437 | A * | 9/1992 | Bristol | 65/102 |
| 5,169,456 | A | 12/1992 | Johnson | |
| 5,281,249 | A * | 1/1994 | Hampton et al. | 65/25.1 |
| 6,257,022 | B1 * | 7/2001 | Caplan et al. | 65/107 |
| 6,301,932 | B1 * | 10/2001 | Allen et al. | 65/106 |
| 6,541,694 | B2 | 4/2003 | Winston | |
| 6,739,729 | B1 | 5/2004 | Blackmon et al. | |
| 7,076,965 | B2 | 7/2006 | Lasich | |
| 2004/0107731 | A1 | 6/2004 | Doehring et al. | |
| 2005/0051205 | A1 | 3/2005 | Mook et al. | |
| 2006/0231133 | A1 | 10/2006 | Fork | |
| 2006/0243319 | A1 | 11/2006 | Kusek | |
| 2007/0089774 | A1 | 4/2007 | Lasich | |
| 2007/0089778 | A1 | 4/2007 | Horne | |
| 2007/0256726 | A1 | 11/2007 | Fork et al. | |
| 2007/0272666 | A1 | 11/2007 | O'Brien | |
| 2008/0000516 | A1 | 1/2008 | Shifman | |
| 2008/0047605 | A1 | 2/2008 | Benitez et al. | |

FOREIGN PATENT DOCUMENTS

| | | |
|---|---|---|
| EP | 1956662 A2 | 8/2008 |
| EP | 1956662 A3 | 12/2009 |
| GB | 770 097 | 3/1957 |
| JP | 58-194751 | 11/1983 |
| JP | 63-021229 | 1/1988 |
| TW | 332104 | 11/2007 |
| WO | WO 2005-042420 | 5/2005 |

OTHER PUBLICATIONS

The International Preliminary Report on Patentability from related Int'l Application No. PCT/US2009/043377 (corrected version) dated Jan. 20, 2011.

Reply to EPO Communication Pursuant to Rules 161(1) and 162 EPC from corresponding EPC Application No. 09 747 261.7, based on PCT/US2009/043381.

Reply to EPO Communication Pursuant to Rules 161(1) and 162 EPC from related EPO Application No. 09 747 259.1, based on PCT/US2009/043377.

Dan Friedman, National Solar Technology Roadmap: Concentrator PV, Magament Report NREL/MP-520-41735, Solar Energy Technologies Program, Jun. 2007, pp. 1-3 (draft version), U.S. Department of Energy.

Geoffrey S. Kinsey, et al., Multijunction Solar Cells for Dense-Array Concentrators, pp. 625-627, 2006, 1-4244-0016-3, IEEE.

David Faiman, Large-Area Concentrators, 2nd Workshop on "The path to ultra-high efficient photovoltaics," Oct. 3-4, 2002, pp. 1-8, JRC Ispra, Italy.

Anja Royne, et al., Cooling of Photovoltaic Cells Under Concentrated Illumination: A Critical Review, Solar Energy Materials & Solar Cells, 2005 (available on-line Oct. 28, 2004), pp. 451-483, 86, Elsevier B.V.

Geoffrey S. Kinsey et al., Concentrator Multijunction Solar Cell Characteristics Under Variable Intensity and Temperature, Progress in Photovoltaics: Research and Applications, May 1, 2008 (online), pp. 503-508, 16, John Wiley & Sons, Ltd.

Sarah Kurtz, Opportunities and Challenges for Development of a Mature Concentrating Photovoltaic Power Industry, Technical Report NREL/TP-5200-43208, Jun. 2011 (revised), pp. 1-32, U.S. Department of Energy.

Ugur Ortabasi et al., Dish/Photovoltaic Cavity Converter (PVCC) System for Ultimate Solar-to-Electricity Conversion Efficiency General Concept and First Performance Predictions, pp. 1616-1620, 2002, 0-7803-7471-1, IEEE.

The International Search Report and Written Opinion from corresponding Int'l Application No. PCT/US09/043377 dated May 28, 2010.

The International Preliminary Report on Patentability from related Int'l Application No. PCT/US09/043381 dated Aug. 16, 2010.

The International Search Report and Written Opinion from related Int'l Application No. PCT/US09/043378 dated Jun. 9, 2010.

ISR and Written Opinion from International Application No. PCT/US09/43381 dated Aug. 25, 2009.

* cited by examiner

METHOD OF MANUFACTURING LARGE DISH REFLECTORS FOR A SOLAR CONCENTRATOR APPARATUS

CROSS-REFERENCE TO RELATED APPLICATIONS

This application is based upon and claims the benefit of the filing date of Provisional Patent Application Ser. No. 61/127,298, filed May 12, 2008, entitled "Solar Photovoltaic Generator," the entire disclosure of which is incorporated herein by reference. This application discloses subject matter related to application Ser. No. 12/436,016, filed contemporaneously herewith, entitled "Photovoltaic Generator with a Spherical Imaging Lens for Use with a Paraboloidal Solar Reflector," by Roger P. Angel, the entire disclosure of which is incorporated herein by reference. This application also discloses subject matter related to application Ser. No. 12/436,001, filed contemporaneously herewith, entitled "Solar Concentrator Apparatus with Large, Multiple, Co-Axial Dish Reflectors," by Roger P. Angel and Warren B. Davison, the entire disclosure of which is incorporated herein by reference.

This invention was funded by the United States Government under the Department of Energy contract No. DE-FG36-08G088002. The U.S. government has certain rights in this invention.

BACKGROUND OF THE INVENTION

Climate change is recognized as a significant problem that has received considerable attention. As a result of worldwide generation of energy from fossil fuels, large amounts of greenhouse gasses are accumulating in our atmosphere. Many experts believe that if something is not done soon to slow or even reverse this accumulation, our climate and the world in which we live will suffer catastrophic consequences. Experts predict that a rise in global temperatures of just a few degrees will melt polar ice, and result in a rise of sea levels enough to put many coastal cities under water. The extinction of many species of plants and animals is also predicted by some scientists. In view of these and other significant adverse effects from burning fossil fuels to generate energy, there is a significant need for a method and apparatus that can generate energy in a cost-effective manner without the generation of significant greenhouse gasses.

The present invention is directed to facilitating conversion of solar energy into useful electrical or chemical energy by processes that either require strongly concentrated solar energy, or are made more efficient or more cost effective with concentrated sunlight. In particular, the present invention is directed to an apparatus for electricity generation through photovoltaic or thermal processes. It may also be used for converting solar energy to chemical energy by thermal or photo chemical reactions.

The efficiency of thermal conversion is limited by the second law of thermodynamics, which requires high temperature and hence highly concentrated light for high conversion efficiency. Photovoltaic conversion efficiency may also be improved in highly concentrated light. Thus, in the past, significant effort and attention has been given to the problem of converting solar energy at high concentration, but the results have not been altogether satisfactory. Despite the availability of solar conversion devices that operate more efficiently in highly concentrated light, high concentration solar energy systems have not yet become a major factor in global solar electricity production. A significant drawback to prior attempts at high concentration systems has been the high cost of the opto-mechanical systems required to provide highly concentrated light to solar conversion devices. Prior efforts have not been cost competitive, in part, because of the unfavorable scale sizes of the optical concentrators. These prior attempts often involved the use of particular conversion devices requiring input of concentrated sunlight at either very low levels or very high levels of power, and such power requirements led for the most part to either very small or very large optical apertures for the sunlight concentrators. This design approach failed to adequately minimize the cost per unit of generated electricity (or other form of energy).

In the past, small unit size was favored for most photovoltaic converters. This led to inefficiencies and high costs. Arrays of large numbers of small units with small optical concentrators were expensive to manufacture, assemble and transport, because they were both large and complex, with many small optical and electrical and thermal components arrayed over a large area. Also arrays of small units conferred little stiffness on large scales, and would be carried as dead weight on a two-axis solar tracker. Substantial additional weight in the form of structural members was needed to control gravity and wind bending and to make connection with the tracking mount. This design approach added significantly to the cost of a tracker to be used in such systems, and failed to achieve adequately minimized cost per unit of generated electricity (or other form of energy).

In the past, very large unit size was favored for solar thermal systems requiring very high solar power input at high concentration. Large optics concentrating in two dimensions to meet these requirements led to inefficiencies. In some systems a thermal converter unit was mounted at the focus of a single large dish, with a dish-engine assembly carried by a two-axis tracker. In other systems, a thermal converter unit was fixed on a tower with sunlight concentrated on it by a field of typically thousands of flat mirrors on heliostats. Both of these design approaches were sub-optimal in terms of minimizing the concentrator system cost per watt delivered, and failed to adequately minimize the cost per unit of generated electricity (or other form of energy).

For large single dishes, structural complexity and both mass and cost per unit area all rise with dish area. In the past, attempts were made to use a large reflector assembled from many small curved reflector segments. In a large reflector made from numerous curved reflector segments, each individual segment must be aligned on a paraboloidal back-up truss structure. A composite large reflector assembled in this manner tended to be heavy and expensive to manufacture and assemble. In many cases, large round dishes were mounted individually on two-axis trackers and set out in a large solar farms. Such large round dishes must be spaced well apart to avoid significant self shadowing in the early morning and late afternoon, resulting in sub-optimal use of land. A further disadvantage of large round dishes was relatively high wind load per unit area, which required heavier and more expensive support structure to resist wind loading.

In the past, very high power concentration was attempted by using a field of heliostats. A significant disadvantage to this approach was the inefficient use of trackers carrying a given reflector area. This inefficiency resulted because the sunlight incident on many of the heliostat mirrors was at angles far from normal incidence, thus the daily average of solar power delivered to the power tower was only a fraction of what could be captured if each mirror could be tracked to face the sun. Another disadvantage was the mechanical complexity of many small two-axis trackers for heliostats.

A further difficulty with many prior solar concentrator systems has been the special demand placed on their two-axis trackers. Compact altitude-over-azimuth mounts on a vertical pedestal have been used. Typical designs were not balanced about the elevation axis, and therefore typically suffered from high, concentrated drive loads and consequently required heavy drive mechanics. Of course, heavy drive mechanics increased the cost of such systems, and in solar energy systems, cost is a critical factor that separates success from failure. Large, high concentration dishes for thermal conversion were often especially compromised in their mechanical structure by a large radial opening for an arm to support a fluid heater, engine or turbine and electromagnetic generator at the focus.

Prior systems for using concentrated sunlight have left significant room for improvement. Solar energy systems are unlikely to have a significant impact on reducing greenhouse gasses in the atmosphere until electricity can be generated using solar energy at a cost that is competitive with electricity generated by burning fossil fuels. Cost is critical to solar energy systems. In fact, cost cannot be over emphasized, because it is so important that cost alone can make the difference between success and failure. As long as solar generated electricity costs more than electricity generated by burning fossil fuels, there is little chance that solar power is going to have a significant impact on reducing greenhouse gasses in our atmosphere. There has been a long felt need for an apparatus and method of manufacture for a solar conversion system that has a low total system cost and that is capable of generating electricity at a cost that is competitive with electricity generated by burning fossil fuels.

OBJECTS AND FEATURES OF THE INVENTION

A central objective of the present invention involves providing a method of manufacture and an apparatus for generating electricity or other forms of solar power at low cost. Cost is of critical importance—otherwise solar conversion systems are unlikely to displace a large percentage of conventional electrical generation plants that generate electricity by burning fossil fuels. The present invention includes a method of manufacture that facilitates a low total system cost for solar conversion.

The present invention involves an apparatus to deliver highly concentrated solar radiation to high efficiency conversion units at the lowest cost per unit power. To achieve this goal, in the design optimization process, total solar radiation delivered to each individual unit in a solar conversion system was taken as a variable parameter, and the aperture of the unit optical collection system and the associated mechanical structure was varied to find the minimum cost per watt of generated electricity. By establishing the power level for minimum cost per watt, highly efficient conversion units could be re-optimized for this power level, with little or no loss in efficiency, or increase in conversion cost per unit power. For example, in the case of concentrator photovoltaic cells used in accordance with the present invention, input power concentrated into unit levels above about 50 W may be accommodated in a conversion unit that incorporates multiple, densely packed cells with active cooling, and provides for equal illumination of all the cells. In addition to being useful in systems employing photovoltaic cells, the present invention also has the advantage of providing low cost input power for optimized thermal and chemical conversion units.

In order to have a discernable impact upon minimizing climate change caused by greenhouse gasses in our atmosphere, a method of manufacture is needed for economically making glass reflectors to be used in a solar conversion system according to the present invention. An objective of the present invention is to provide a method of manufacture that allows the use of low cost float glass for such glass reflectors. Another objective of the present invention is to provide a method of manufacture that is capable of high speed and fast production rates. The present invention includes an economical method of manufacture that is capable of producing glass reflectors made from float glass at low cost and at a speed fast enough to accommodate the full output of a conventional float glass factory production line in a continuous manufacturing process.

One feature of the present invention is that the power levels to minimize cost per watt are achievable in the intermediate range between about 1 kW to about 20 kW, a range that has been barely touched by previous solar concentration systems.

Concentration of solar radiation in accordance with the present invention is made by a rigidly co-aligned array of intermediate size dish reflectors pointed substantially directly at the sun by a two-axis tracker. Each intermediate size dish reflector powers a compact converter at the focus of the reflector. An advantage of the present invention is a clean separation of compact energy conversion units from a plurality of relatively simple but inherently large energy collection elements. In this way, aspects of mass production, transport assembly, upgrade and maintenance of the three major components, i.e., the reflector dishes, the trackers, and the conversion units, can be separately optimized. In accordance with the present invention, optical throughput is maximized by using conversion units whose cross sectional area is much less that the area of the reflector dish needed to power them.

During the day, the sun rises in the east, moves across the sky, and sets in the west. There is a need to adjust the orientation of reflectors so that they point in the direction of the sun as it moves across the sky. In order to make a solar generation system that is cost competitive, it is important to minimize the cost of the supporting mechanical structure used to track the sun. This is achieved in accordance with the present invention by supporting multiple reflector and converter units in a rigid, lightweight spaceframe. A spaceframe in accordance with the present invention is a rigid, lightweight, open truss structure that maximizes stiffness and strength while minimizing mass per unit area of collected light. The open truss structure extends in three dimensions to achieve both high stiffness against bending by gravity and wind, and high strength to survive occasional very high winds. Two dimensions extend across the area of sunlight collected, and the third dimension extends in the perpendicular direction, along the optical axis linking the reflector units below and the converter units above.

In accordance with the present invention, the cost of the reflectors and tracker is further minimized by use of inexpensive materials, such as glass and steel. A feature of the invention is that individual reflectors take the form of a large glass monolith, as opposed to an array of discrete abutting segments. Monolithic construction simplifies glass reflector manufacturing and integration, and minimizes the number of support points per unit area for a given glass thickness and mass per unit area (areal density).

One feature of the present invention is that the primary dish optics have optical quality which results in only moderate degradation at the concentration limit set by the diameter of the sun's disc, with the capability of delivering solar radiation at high concentration, preferably 10,000 times, at the direct focus of a generally paraboloidal reflector of short focal ratio. Such high concentration is not always required at the actual point of conversion, but along with accurate tracking of the rigid spaceframe structure, this level of concentration provides maximum flexibility for the design of conversion units to exploit the advantages of the solar concentration.

It is another feature of the present invention that the aspect ratio of the array of reflectors carried by each two-axis tracker is wide and low. The horizontal extension provided in the present preferred design minimizes shadowing at low sun elevation by adjacent units in a field of multiple units, thus maximizing land use. This preferred design also minimizes wind loading.

A feature of the present invention is that the drives have a high mechanical advantage, which advantageously minimizes parasitic loads from drive motors. An additional feature of the present invention is that the drive elements are applied at a large radius, which advantageously minimizes drive forces and mass of the drive components.

SUMMARY OF THE INVENTION

The present disclosure includes 1) an apparatus to deliver concentrated sunlight for production of electrical energy by conversion units, and 2) a method of manufacture for silvered glass reflectors suitable for use in making such an apparatus.

An apparatus in accordance with the present invention incorporates a plurality of large dish reflectors co-aligned in a rigid array, with provision for holding a compact solar conversion unit above each reflector dish. The supporting structure for the reflectors and converter units is made as a 3-dimensional spaceframe, in which the members linking the reflectors to the conversion units provide depth to the structure and thus serve also to confer high overall stiffness. The spaceframe together with the elevation bearings and drives provide an elevation structure for a two-axis, elevation-over-azimuth tracker with azimuth bearings and drives. When the tracker is positioned so that the reflector array is oriented to face the sun, strongly concentrated sunlight is delivered to the conversion units or converter units. The invention may be advantageously used with a variety of conversion units, including conversion units generating electricity through photovoltaic or thermal processes, or conversion units storing solar energy as chemical energy by thermal or photochemical reactions.

Preferably the converter units used with the apparatus are small, so as not to significantly shadow the reflector dishes. An apparatus according to the present invention, including a set of converters and appropriate heat exchangers, forms a self-contained solar power conversion system. The present invention is especially adapted to provide solar energy conversion on a large scale by employing a plurality of such self-contained solar power conversion systems, which may be mass-produced. Large scale arrays of solar power conversion systems may be advantageously fielded or deployed in locations having strong direct sunlight, such as the desert southwest of the United States.

Significant benefits and advantages are realized from using a plurality of optimally sized reflector dishes on a single two-axis tracker in accordance with the present invention. This configuration allows efficient use of material (in terms of mass per unit power of concentrated sunlight). Preferably the array is balanced about the elevation bearing to minimize forces and moments due to wind and gravity. The reflectors are preferably arrayed in a rigid spaceframe, wherein the spaceframe has primary struts in all three dimensions, to maximize overall stiffness, while at the same time providing nodes optimally placed to hold: the individual reflector dishes; the conversion units; and the mounting points for elevation bearings and drives. In the most preferred embodiments of the invention, the spaceframe consists largely of a rectangular framework of steel struts with diagonal braces, thus providing very high stiffness to weight ratio. Each large cell of the spaceframe houses a dish reflector below and its associated conversion unit above.

The dish reflectors are preferably made as large monoliths of back-silvered, low-iron float glass, each dish reflector being supported by an open truss structure. Back-silvered glass reflectors are preferred for this invention because of the superior protective and structural functions of glass, and the very high reflectance of silver. Glass is preferred also because of its rigidity and chemical and dimensional stability, holding the true figure of the reflector on a wide range of spatial scales. Monolithic construction of the glass is preferred because a large reflector is structurally more efficient when made as a monolith rather than as an array of smaller segments, and large glass monoliths may be manufactured in very high volume at low cost, in accordance with a method of manufacturing disclosed herein. Silver is a preferred reflecting material, but other materials such as aluminum might be substituted for silver with some degradation in performance. The longevity and stability of back-silvered glass reflectors provide good durability characteristics in solar applications exposed to outdoor weather conditions. Low-iron soda-lime silicate glass is a preferred material because of its low solar energy absorbance. However, those skilled in the art will appreciate that other materials may be substituted without departing from the spirit of the invention. Although the word "glass" is used in the description below, unless otherwise stated, it should be understood that low-iron soda lime float glass is preferred for this invention.

Preferably the dish reflectors have an axisymmetric concave figure and a substantially square or hexagonal perimeter. The reflectors are arrayed in adjacent cells of the supporting spaceframe, matched in size and shape so as to minimize gaps and energy losses. The reflectors are preferably both a relatively large optimum size and monolithic, to facilitate both manufacture and cost at the minimum cost per unit area. An important feature of the design is that the monolithic reflector dishes are provided with a rolled edge, to increase rigidity and reduce the number of support points, and thus further reduce the cost of manufacture and installation of each glass monolith. A rolled edge provides structural advantages, and has not been previously exploited in the shaping of solar glass reflecting dishes. The reflectors are made with glass preferably of around 4 mm thickness, and supported on an open truss by pads preferably spaced about every half meter. The reflector is preferably bonded to the support pad with a compliant adhesive. The dishes have a paraboloidal shape or another concave figure, optimized according to the design of the generator or converter unit selected for use near the focus.

To minimize the cost per unit area of the reflector and its assembly, the individual monolithic glass reflector dishes are optimized in size using certain cost-benefit tradeoffs, and are preferably made as large as practical consistent with other important considerations. The present invention advantageously provides significant cost savings by allowing glass reflector dishes to be made from a full standard width of float glass production, generally around 3.3 m, which is strongly preferred. Each large square or hexagonal reflector is preferably attached to a rigid, lightweight steel truss support. In one preferred example, the truss provides on its upper surface a cradle of sixteen points in a four-by-four grid for attachment of a substantially square monolith of approximately 4 mm thickness, and the truss extends below to form four nodes in a square, to attach to lower corners of a unit cell of a rectangular elevation spaceframe. For a preferred square reflector formed from 3.3 m wide glass, the active area is approximately nine square meters, and thus the concentrated solar power delivered to each dish focus is typically around 8 kW (for 1000 watts per square meter insolation and an average reflectivity more than 90%). Conversion units most appropriate for use with this preferred embodiment of the invention are those which can operate efficiently at around 8.5 kW input power level per unit.

Taking the above constraints together, a unit reflector cell for a substantially square dished reflector preferably takes the form of a right prism with square cross section. A preferred embodiment for a reflector is supported from the corners of the lower square end of the unit cell, and the compact converter or generator is supported from the corners of the opposite, upper end by thin diagonal elements, preferably in tension. The unit cell has diagonal members across all six faces, not just the converter face, making it very stiff in all three deflection directions and all three twisting directions. A plurality of such unit reflector cells are linked in an array to form the deep, rigid elevation spaceframe. The elevation structure of the two-axis tracker preferably comprises an n×m array of the cells configured to form a rigid spaceframe. This spaceframe may incorporate offsets between horizontal rows of units to improve mechanical performance. In either case, most structural members act both locally to hold the unit converters in rigid alignment with their associated reflectors, and overall to provide a very stiff spaceframe. In order to achieve an optimum tradeoff between low cost and performance, the cross sections of the truss struts are preferably chosen such that the deflections under maximum operating loads are nearing their budget for bending misalignment of the different dish axes, while at the maximum survival wind load the stresses are nearing their failure limit. The configuration of the spaceframe and supporting structure according to the present invention has been designed to achieve significant structural integrity at low cost, which can be a crucial consideration in a practical competitive system for generating solar electricity. The spaceframe structure in accordance with the present invention yields the required performance with minimum mass per unit power, and achieves the significant advantage of reduced overall cost.

Two preferred embodiments of the apparatus are described in detail below, both employing an altitude over azimuth configuration. A first, and larger, described embodiment illustrates a configuration in which the unit cells are in a co-planar array, perpendicular to their common optical axis, and the azimuth bearing turns on a horizontal track anchored to the ground. This first illustrated embodiment is more suitable for larger scale units built upon a level site. The illustrated large embodiment of the invention has twenty-seven unit cells in a regular three-by-nine element spaceframe. The rigid elevation structure includes a spaceframe with two braced C-rings underneath, forming a virtual pivot near its center of gravity. The load from the C-rings is taken almost directly to a circular azimuth track on the ground via a squat azimuth platform with four corner trucks. Each truck has an upward facing wheel(s) to support a C ring and a downward facing wheel(s) directly below that ride around the azimuth track.

In a second described embodiment of the apparatus employing an altitude over azimuth configuration, the elevation structure comprises two staggered rows of unit cells with the upper row set back and the lower row forward. The front bottom edge of the top row coincides with the back bottom edge of the top row to form a common structural member extending the full length of the framework and passing through its center of gravity, thus providing a very stiff central member for support of the elevation bearing. An important feature of this embodiment is that little structure is required in addition to the two lines of cells to form a complete and very stiff spaceframe and elevation structure. In this illustrated embodiment, each row of reflector cells includes also a central narrow cell to accommodate the elevation axis bearing. Azimuthal motion is about a pedestal centered below the elevation axis. This pedestal pivots on a post that preferably takes the form of a steel truss set in a hole in the ground with crushed rock or gleaned land rubble, preferably avoiding any use of concrete in the entire assembly in order to minimize costs.

Silvered glass reflectors for incorporation into a solar concentrator for use in the above-described embodiments, and which have utility in other alternative embodiments, may be manufactured according to low cost method using float glass. This method of manufacture contributes significantly to reduce the overall cost of a solar power system.

In accordance with the present invention, the starting point for the reflector manufacturing process is float glass. Float glass is strongly preferred because of its high quality and low cost. Float glass also employs mature technology that can allow production of glass reflectors in a very large volume. In order to have a significant impact on the reduction of greenhouse gasses and carbon pollution in the atmosphere, it is desirable to have a method of manufacturing glass reflectors for solar energy conversion systems at a sufficiently low cost and at a sufficiently high volume to facilitate the mass production of systems for generation of very high power levels of electricity. The process here described may be advantageously integrated into a float glass production line, so that freshly formed hot glass from the float glass production line can be shaped before it is annealed and cooled. The manufacturing process according to the present invention provides the capability of utilizing the entire output of a float glass factory to produce glass solar reflectors made in one continuous process or production line. The manufacturing process is thus designed to work at very high speed, for example allowing a new glass reflector to be made every ten seconds, and is capable of accommodating the typical production rate from a float glass factory for 3.3 m square sheets 4 mm thick. The manufacturing process may alternatively be conducted off-line at a slower rate if desired, but the capability of high production rates in accordance with the disclosed method of manufacture is a significant advantage provided by the present invention.

The first step in the manufacturing process comprises cutting a freshly formed and still hot but rigid float glass ribbon into reflector sized pieces. This is followed by the step of positioning each reflector-sized piece of glass above a full body mold. Each reflector-sized piece of glass is then heated while its corners are restrained against lateral motion. As the reflector sized piece of glass softens in the heated environment, the glass sags and stretches, touching and conforming to the perimeter of the mold and otherwise freely descending to take up the approximate shape of the dished reflector, while keeping its smooth, specular finish. The corner restraints are provided to prevent wrinkling, by forcing the glass to stretch everywhere as it sags. The desired shape of the dish is taken on by the reflector-sized piece of glass when it reaches and lightly touches across the full body of the mold. This method achieves the goal of precise shaping of the reflector-sized piece of glass without significantly degrading the optical smoothness of either the front or back surface of the glass. A stainless steel mold is preferably used with cusped grooves machined into it, so as to accurately define the figure while providing the advantage of keeping the fraction of the glass area marred by contact with the mold to well under 1%. While the reflector sized piece of glass is still soft and the concave dish is being shaped, forming tools are used at the edges of the glass to press back the glass to form rolled edges against a rounded edge of the mold. As soon as the shaping is complete, the reflector-sized piece of glass may be rapidly cooled to stiffen it to the point where it can be removed from the mold without significant distortion. In a continuous production line, the mold may be routed back to the beginning of the production line and recycled to shape the next reflector. It is desirable to minimize thermal cycling of the mold, because thermal cycling could shorten the lifetime of the mold. The disclosed method of manufacturing achieves the desirable result of minimizing thermal cycling of the mold by use of cusped grooves in the operative surface of the mold corresponding to the piece of glass that is being molded, and the grooves minimize thermal conduction from glass to mold. In accordance with a preferred method of manufacture, thermal cycling of the mold is further reduced by coating the operative mold surface proximate to the piece of glass that is being molded so as to be highly reflective to heat radiation fluxes experienced during heating and cooling.

Radiative heat transfer is a preferred method to heat and cool a piece of float glass that is being molded, in order to achieve desirable fast rates of production. Preferably many molds will be in use simultaneously, configured for example in a production line, to keep up with a typical factory rate of sheet production of float glass. The mold cycle according to a preferred manufacturing process comprises: positioning a reflector size glass sheet into a corresponding relationship with a mold; heating the glass sheet by rapid radiative heating to soften the glass sheet; maintaining the glass sheet in a heated environment until the glass sheet is shaped into a reflector by sagging, stretching and settling the glass sheet across the mold; shaping the edges of the glass sheet; cooling the glass sheet by rapid radiative cooling; removing the shaped glass reflector for annealing and cooling; and returning the mold for reloading. The disclosed manufacturing process is capable of rapid production of glass reflectors, and is adapted to achieve an estimated processing time of about three minutes for completion of these steps. The advantages of production rate offered by the disclosed manufacturing process become more apparent by considering that a new glass sheet may be processed into a shaped glass reflector about every ten seconds, by using twenty or more molds in a production line in accordance with the present invention. In such a production line using twenty molds, a production line length of approximately 100 meters provides several minutes of thermal processing before a mold is returned, based on a production line length that is about twenty or more times the mold-to-mold separation.

DETAILED DESCRIPTION OF PREFERRED EMBODIMENTS

Figure 1:
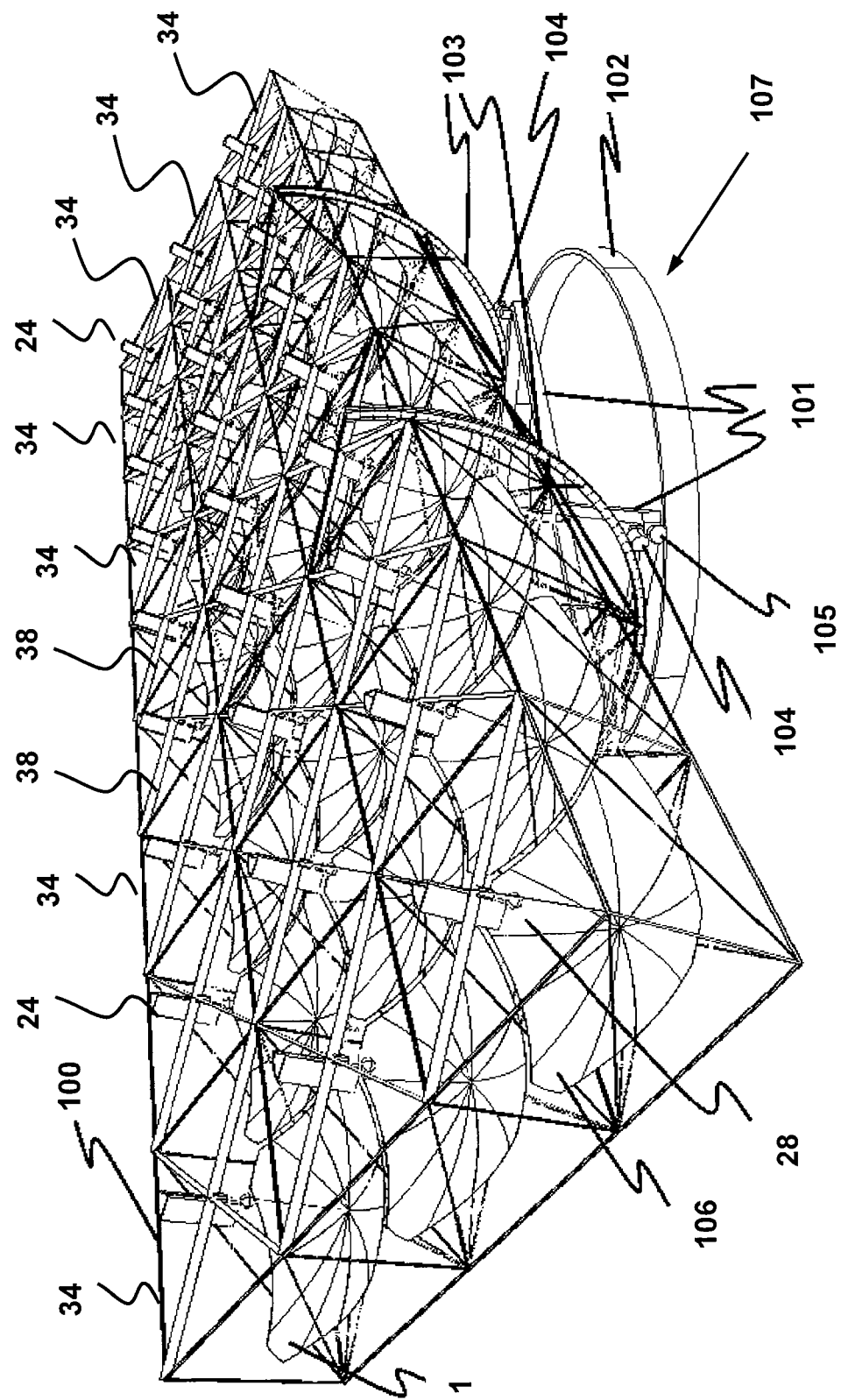
FIG. 1 is a perspective view of an array of reflectors mounted on a moveable support with a two-axis tracking system, and having distributed solar converter units.
Figure 2:
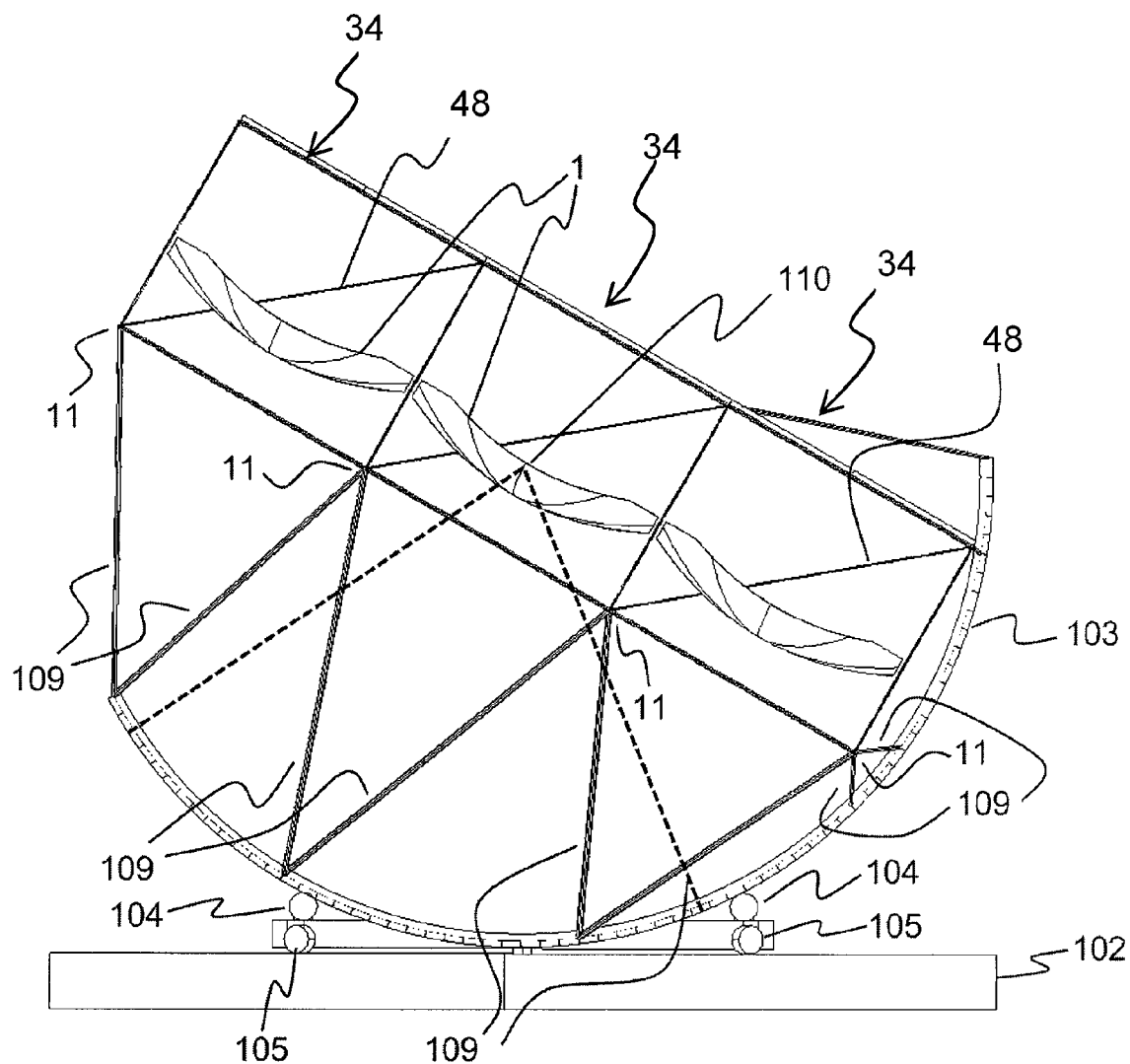
FIG. 2 shows a side view of an embodiment according to FIG. 1, viewed along the elevation axis of the two-axis tracking system.
Figure 3:
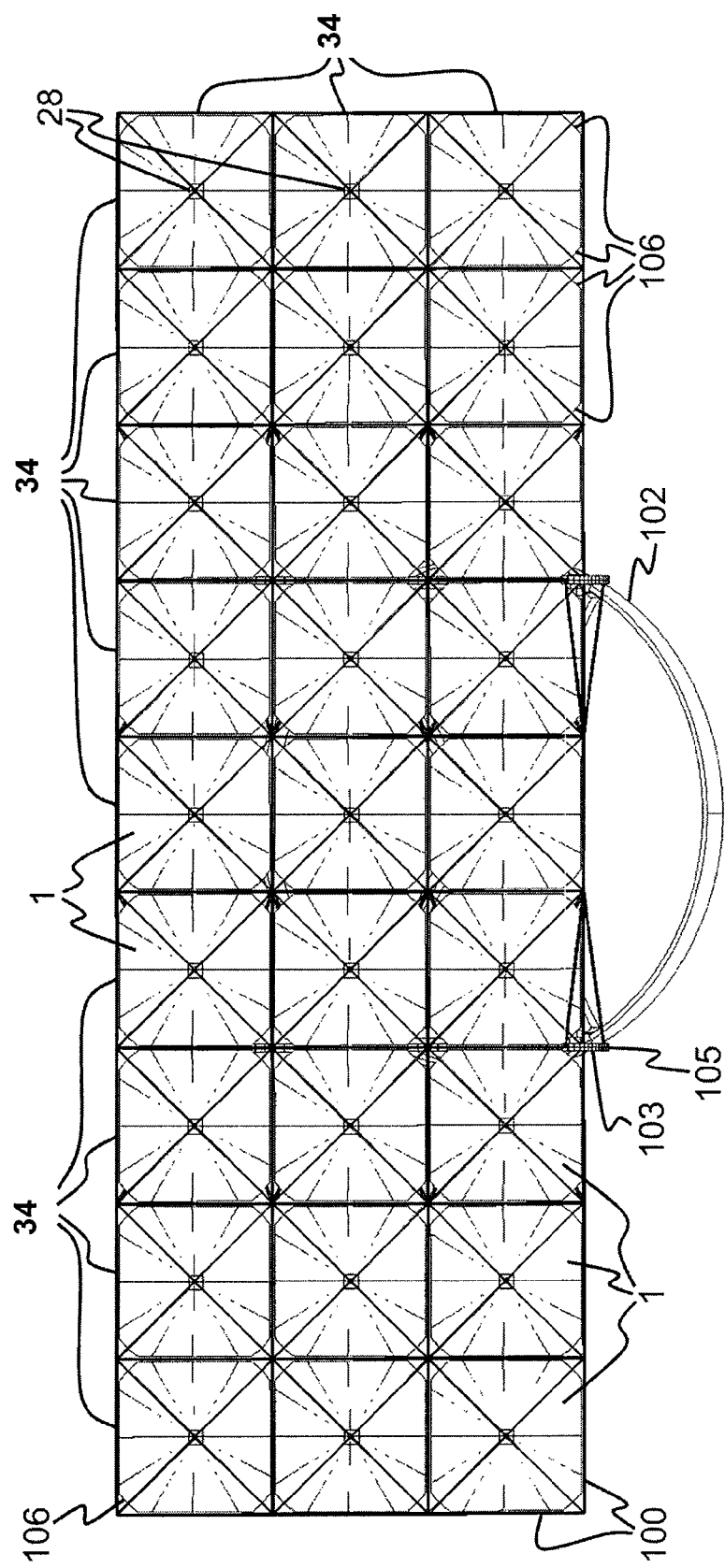
FIG. 3 shows a top view of an embodiment according to FIG. 1 viewed along the optic axis, as seen from the sun direction.

FIG. 1, FIG. 2 and FIG. 3 illustrate a presently preferred embodiment of the invention comprising a plurality of unit reflector cells 34 with large paraboloidal reflectors 1 held co-axial in a rigid framework 100. In the illustrated example, an array of twenty-seven unit reflector cells 34 is shown in a rectangular grid that is three rows by nine columns, but other configurations and arrangements may be used with a plurality of concentrators arranged in various other configurations. It is desirable to have the capability of pointing the array of reflectors 1 at the sun as the sun moves across the sky during the day. In order to accomplish this, the common axis of the reflectors 1 is oriented to the sun by a two-axis tracker 107. In this exemplar embodiment, a flat truck 101 turns on a circular track 102 on the ground to provide azimuthal rotation of the framework 100 supporting the paraboloidal reflectors 1. Elevation motion is provided by two C-rings 103 attached to the rigid framework 100, which turn about a virtual axis 110 on upper wheels 104 above and adjacent to truck wheels 105. Diagonal supports for the elevation ring 109 and diagonals in the structure 48 provide stiffness. In this preferred embodiment, the paraboloidal reflectors 1 are nearly square or substantially square with clipped corners 106, in order to minimize the reflective area that would otherwise be lost, and are arrayed in a rigid framework 100 of square or rectangular symmetry, so that nearly all of the sunlight intercepted by the entire array of unit reflector cells 34 is delivered to the respective paraboloidal focus 28 of each of the reflectors 1.

Figure 4:
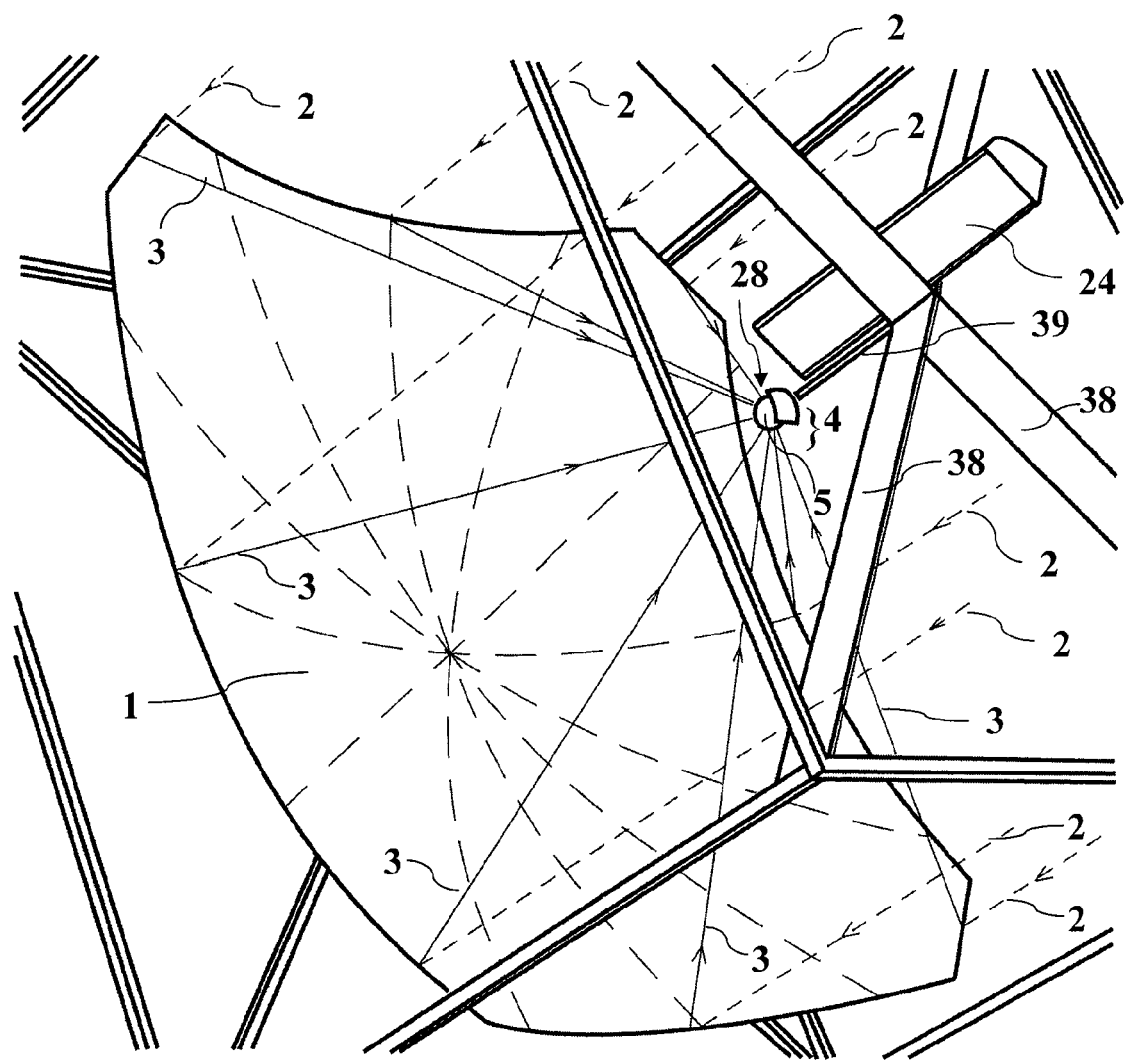
FIG. 4 is an enlarged perspective view (partial) of an embodiment according to FIG. 1, showing a paraboloidal reflector and an especially preferred converter unit having a ball lens.
Figure 5:
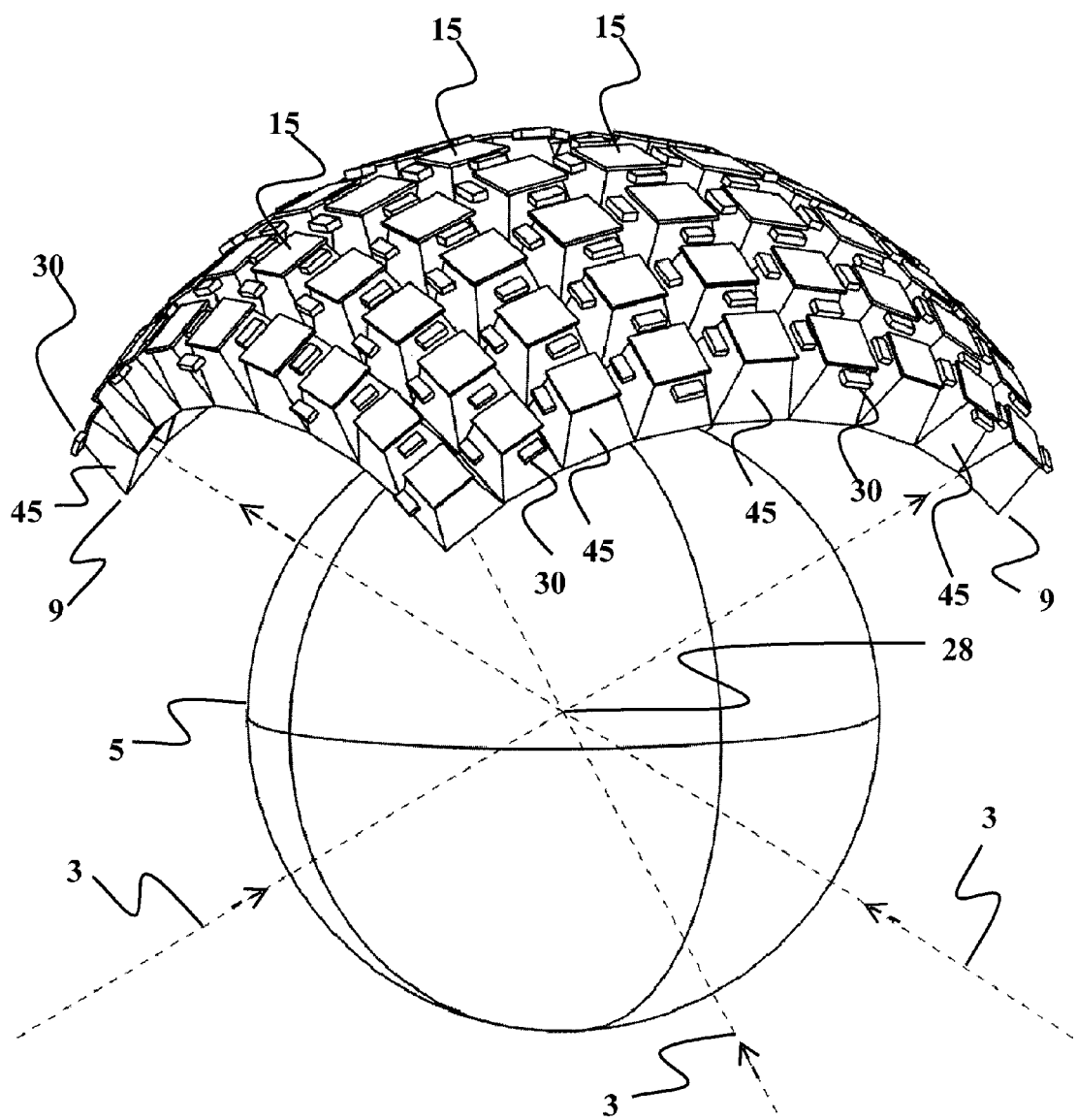
FIG. 5 is a perspective view of an especially preferred glass ball lens for use at the focal point of a solar converter unit in accordance with the present invention, and showing an especially preferred array of secondary concentrating reflectors appropriately positioned relative to the glass ball lens, with all of the supporting structure removed for the sake of clarity.

FIG. 4 and FIG. 5 are perspective views of a unit reflector cell 34 with a converter in the form of a photovoltaic generator 4 and paraboloidal reflector 1. Sunlight entering the system enters as incoming solar radiation or rays 2 which are reflected by the mirror 1. The mirror 1 is shaped so that reflected solar radiation or rays 3 are directed toward the focus 28, where a photovoltaic generator 4 is located, in this illustration including a ball lens 5. The mirror 1 preferably has a substantially paraboloidal reflecting surface that reflects as much of the sunlight 2 as possible and concentrates it at the location of the generator 4. The mirror 1 is preferably fashioned with a thin silver coating on the backside of low iron glass. However, a front-coated mirror, while not preferred, may be provided as an alternative, and alternative reflective coatings may be used on the glass with other metallic or dielectric coatings. In addition, the mirror may be fabricated from alternative materials that nevertheless provide the desired reflection of sunlight toward the generator 4. Although the reflector 1 is preferably substantially paraboloidal in configuration, other curved surfaces may be employed as well with some degradation in performance. A paraboloidal shaped reflector 1 is preferred, because it will reflect parallel incoming rays 2 to a focal point 28. Since the incoming solar radiation is not precisely in the form of parallel rays 2, alternative shapes of the reflective surface 1 may be utilized to reflect rays 3 to a focus 28 at which the generator 4 is located. However, the combination of elements comprising the mirror 1 of the preferred embodiment described herein is believed to provide an optimum tradeoff between cost and performance. In a preferred embodiment wherein the reflector 1 is substantially paraboloidal, deviation of the shape of the reflective surface from the desired paraboloidal shape may be characterized as surface slope errors in the reflective surface of the primary paraboloidal mirror 1, and any converter to take full advantage of the present invention should provide some tolerance for such errors as well as some tolerance to tracker pointing errors. This is a desirable feature in achieving a degree of cost effectiveness in manufacture and operation.

An example of a converter, in the form of a photovoltaic generator 4, for use at the focus 28 of the paraboloidal mirror 1 is shown in the perspective view of FIG. 5. The generator 4 comprises a ball field lens 5 and has a plurality of secondary reflectors 45 concentrically located about the ball field lens 5, wherein the plurality of secondary reflectors 45 direct the concentrated light onto a plurality of concentrator photovoltaic cells 15 as shown in FIG. 5. The photovoltaic cells 15 generate electricity directly from solar radiation. The structure, function and operation of the generator of FIG. 5 and other photovoltaic generators of this type is described in more detail in application Ser. No. 12/463,016, filed contemporaneously herewith, entitled "Photovoltaic Generator with a Spherical Imaging Lens for Use with a Paraboloidal Solar Reflector," by Roger P. Angel, the entire disclosure of which is incorporated herein by reference.

The concentrated sunlight 3 that passes through the ball lens 5 forms an image of the primary paraboloidal reflector 1 on a concave spherical shaped surface 9 where secondary reflectors 45 are located in a position concentric with the spherical lens 5. FIG. 5 shows only the ball lens 5, bypass diodes 30, and a multiplicity of square photovoltaic cells 15 placed immediately behind secondary reflectors in the form of mirrored frames 45 with approximately square inputs. All other structure is omitted for the sake of clarity. The plurality of photovoltaic cells 15 are electrically connected together in series to combine the electrical power produced by each cell 15 into a total output of electricity from the generator 4. The generator 4 includes a system (not shown) to actively cool the cells 15 by water pumped to a radiator, for convective cooling to the air.

A significant aspect of the generator 4 is that the intensity of the solar radiation 3 across all the photovoltaic cells 15 is stabilized by the ball lens 5 against pointing errors of the tracker 107, for a design that is tolerant of surface slope errors in the reflective surface of the primary paraboloidal mirror 1. Even if the tracker 107 is not pointed directly at the sun, the light intensity of the image formed by the ball lens 5 at the entrance to the prismatic reflectors 45 remains relatively constant and provides equal illumination of all of the cells 15 for a significant range of pointing errors. Another significant aspect of the generator 4 is the action of the secondary reflectors 45 in further improving tolerance to mispointing and in opening substantial gaps between adjacent cells 15. The gaps provided between adjacent cells 15 allows placement of bypass diodes 30 and interconnecting wiring in close proximity to the cells 15, without interference to either their optical input or to their electrical and thermal outputs. Thus the generator 4 of FIG. 5 provides for the high solar power input from the concentrator of this invention, both by flux stabilization, so as to ensure high power output from many cells 15 connected in series, and by a clear thermal path to remove the waste heat from a close array of intensely illuminated cells 15.

FIG. 2 illustrates the elevation support and drive of the rigid framework 100 according to FIG. 1, in a view seen along the direction of the elevation axis 110 perpendicular to the plane of the drawing, and passing through the center of the arc of the C-ring 103. Rotation about this elevation axis 110 is defined by the motion of the C-rings 103 on their supporting wheels 104, not by any physical bearing on the axis 110. The C-rings 103 are braced by in-plane struts 109 that link to nodes 11 of the unit reflector cells 34 in the rigid framework 100. FIG. 3 illustrates the rigid framework 100 according to FIG. 1 as seen along the direction of the optic axis, and shows how the substantially square dish reflectors 1 pack efficiently in the rigid framework or spaceframe 100 to capture most of the sunlight 2 incident on the elevation spaceframe 100.

FIG. 4 illustrates a preferred embodiment of a thermosiphon for passive removal of waste heat from the generator 4. Heat at the generator 4 boils a working fluid, causing vapor to rise up the thermosiphon tube 39 to a convective structure 24 with air-cooling located in the upper quadrant of the diagonal support braces 38. In the illustrated preferred embodiment, the convective structure 24 remains in an orientation above the generator 4 over the entire range of elevation angles contemplated in practice for the elevation axis 110, so that the condensed fluid will return to the generator 4 by gravity. This provides a cost effective design for the circulation of cooling fluid in the thermosiphon tube 39 and the convective structure 24 without adding the additional cost and maintenance of a pump.

Figure 6:
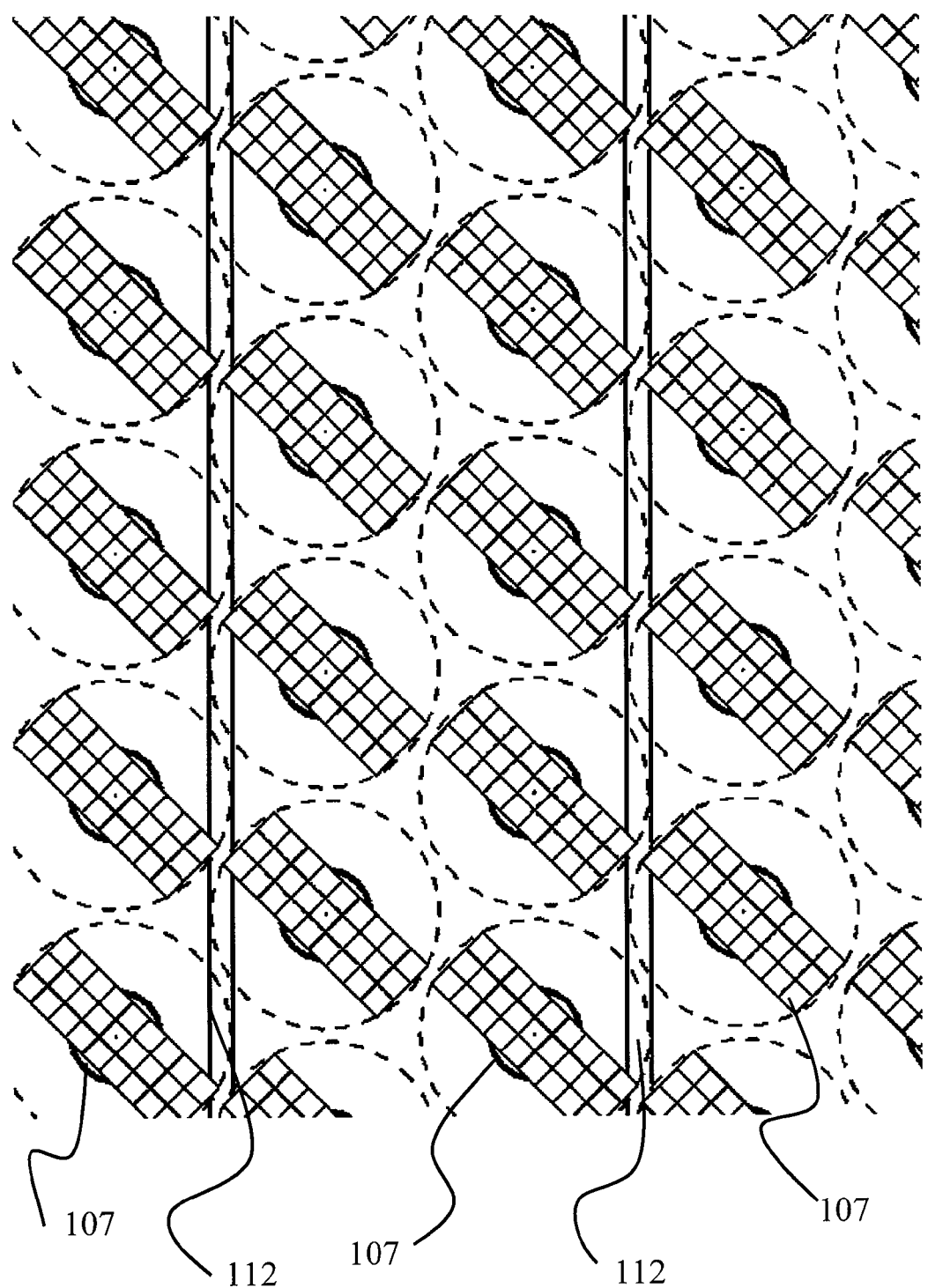
FIG. 6 is a plan view of a plurality of arrays of reflectors according to the preferred embodiment shown in FIG. 1, in a configuration suitable for a solar farm.

FIG. 6 illustrates quantitatively a preferred placement of multiple tracker units 107 of this embodiment, laid out in a grid of equilateral triangles, sized to allow clearance for full azimuth rotation with no possibility of collision. A preferred ratio of three for projected horizontal length to projected height is advantageous, as shown in this illustrated example, because this ratio minimizes self shadowing at low sun elevation in the early morning and late afternoon, and also minimizes wind loading. Given rows oriented in the north-south direction, when the sunlight is coming from due east or due west, there is then no self shadowing loss for solar elevations above $\tan^{-1}(1/3)=18.4°$ degrees, and only 1/3 of the unit cells would be shadowed for 12.3° solar elevation. The ratio of reflector area to land area for the placement illustrated is approximately 25%. Because in this preferred embodiment all reflectors 1 are coplanar and in an open truss structure 100, wind loading may be minimized by stowing the tracker 107 in the zenith pointing position with the reflector plane horizontal in very high winds. Maintenance roads 112 are shown placed every two rows in one direction. By suitable azimuth and elevation rotation, ready access for front or back service is thus provided for all trackers 107.

Figure 7:
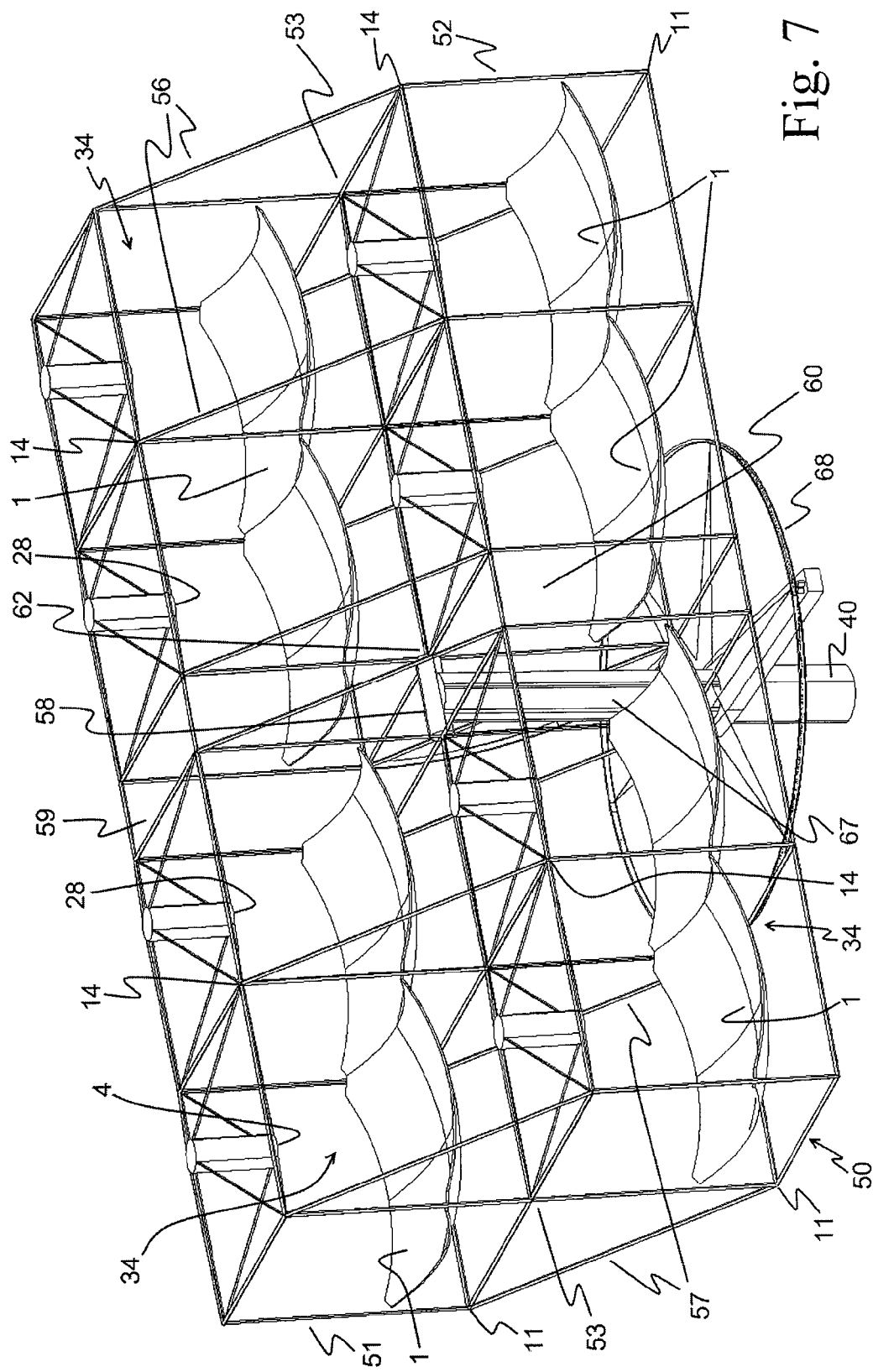
FIG. 7 is a perspective view of an alternative embodiment mounted on a moveable support with a two-axis tracking system.
Figure 11:
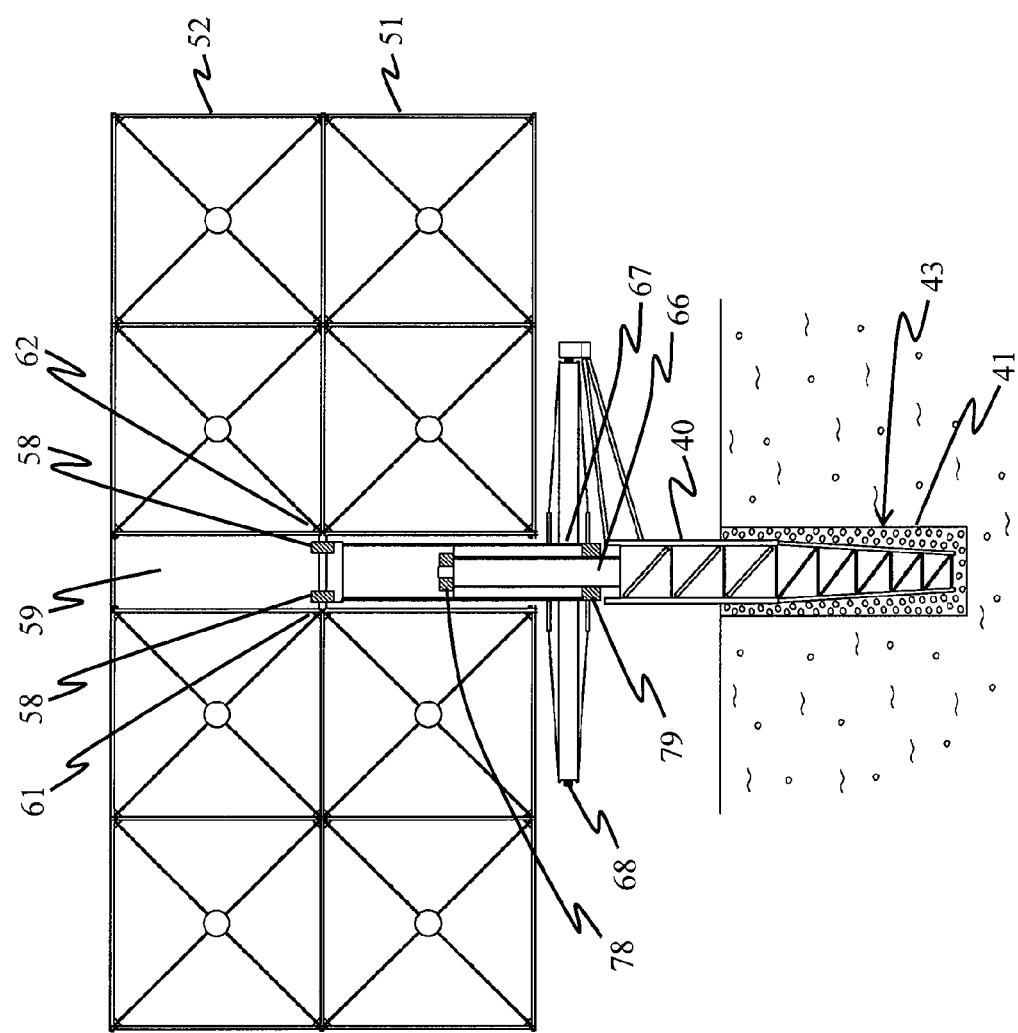
FIG. 11 shows an embodiment according to FIG. 7 when pointing at the horizon viewed along the optic axis, showing details of an azimuth bearing and pedestal foundation.

A second presently preferred embodiment of the invention is shown in FIG. 7. This alternative embodiment comprises a plurality of large paraboloidal reflectors 1 held co-axial in a rigid framework 50, but with a smaller array of eight unit cells 34 in a configuration of two rows 51 and 52 and four columns. In order to point the array of reflectors 1 at the sun, the common axis of the reflectors 1 is oriented to the sun by a two-axis tracker with altitude over azimuth bearings. As shown in FIG. 11, azimuthal motion is provided by a vertical axis bearing 78 and 79 set on a pedestal mount 67. The reflector array is turned in elevation by a horizontal-axis elevation bearing 58 set above the azimuth bearing 78 and 79.

In the alternative embodiment shown in FIG. 7, the reflectors 1 are preferably generally square or substantially square with clipped corners, and each reflector 1 is housed in a unit reflector cell 34, taking the form of a square-based, right prism with provision to support a unit generator 4 near the focus 28. As shown more clearly in FIG. 11, (which is a view along the optical axis), the elevation spaceframe 50 is configured so that the outline as seen from the sun is rectangular and nearly all of the sunlight intercepted by the entire array is directed to the focus 28 of the plurality of the reflectors 1.

Figure 10:
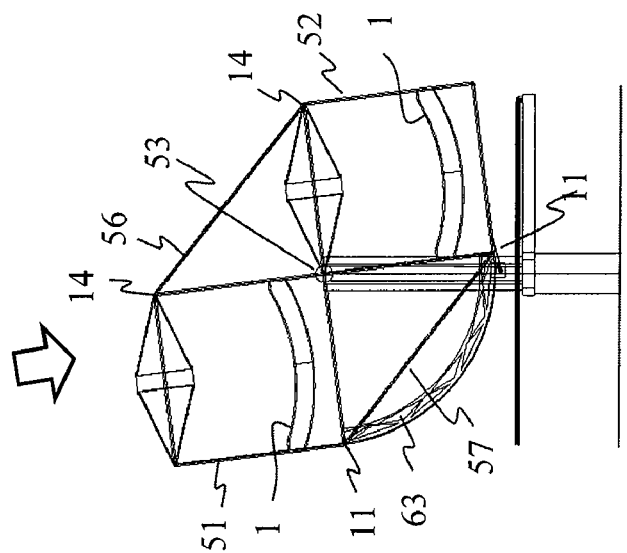
FIG. 10 shows a side view of an embodiment according to FIG. 7 with a two-axis tracking system set at high elevation angle, viewed along the elevation axis.
Figure 9:
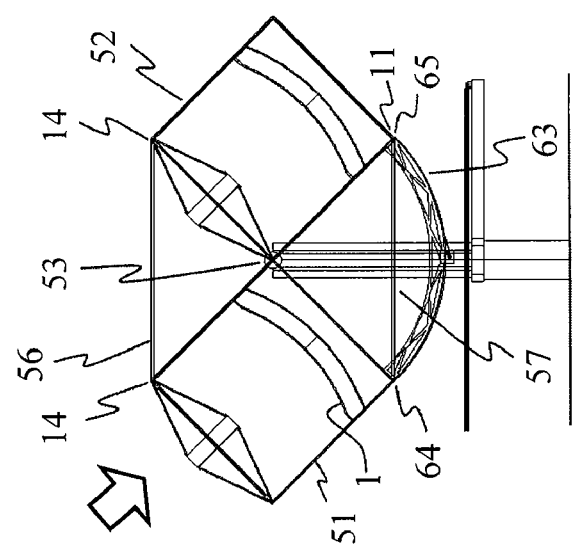
FIG. 9 shows a side view of an embodiment according to FIG. 7 with a two-axis tracking system set at 45° elevation angle, viewed along the elevation axis.
Figure 8:
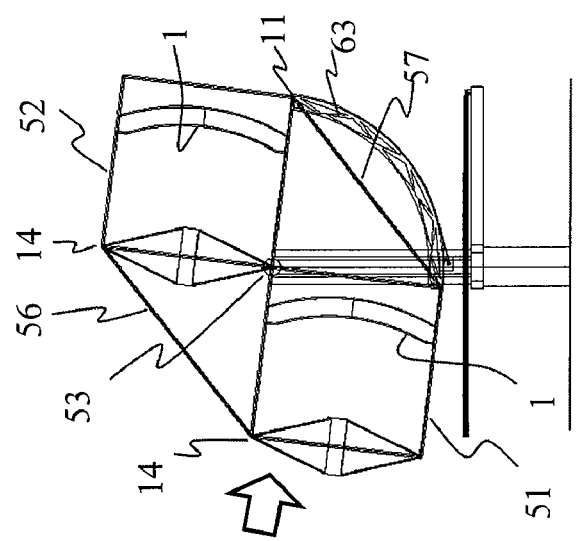
FIG. 8 shows a side view of an embodiment according to FIG. 7 with a two-axis tracking system set at low elevation angle, viewed along the elevation axis.

The forward/backward displacement of the two staggered rows 51 and 52 is illustrated most clearly in the views along the elevation axis shown in FIG. 8, FIG. 9 and FIG. 10. In FIG. 8, the elevation angle is low, in FIG. 9 the elevation angle is at 45°, and in FIG. 10 the elevation angle is high. The upper row of cells 51 is set forward and the lower row 52 is positioned back so that the front lower edge of the upper row 51 coincides with the back upper edge of the lower row 52, and a common structural member 53 is provided in the framework 50. This common structural member 53 is made coincident with the elevation axis, and passes close to the center of gravity of the complete elevation structure as detailed in FIG. 7. The elevation spaceframe 50 is completed with the addition of front and rear stiffening members 56 and 57, respectively, between the upper row 52 of cells and the lower row 51. The front stiffening members 56 link upper front corners 14 of the two rows 51 and 52 of cells, and the rear stiffening members 57 link lower back corners 11.

Figure 12:
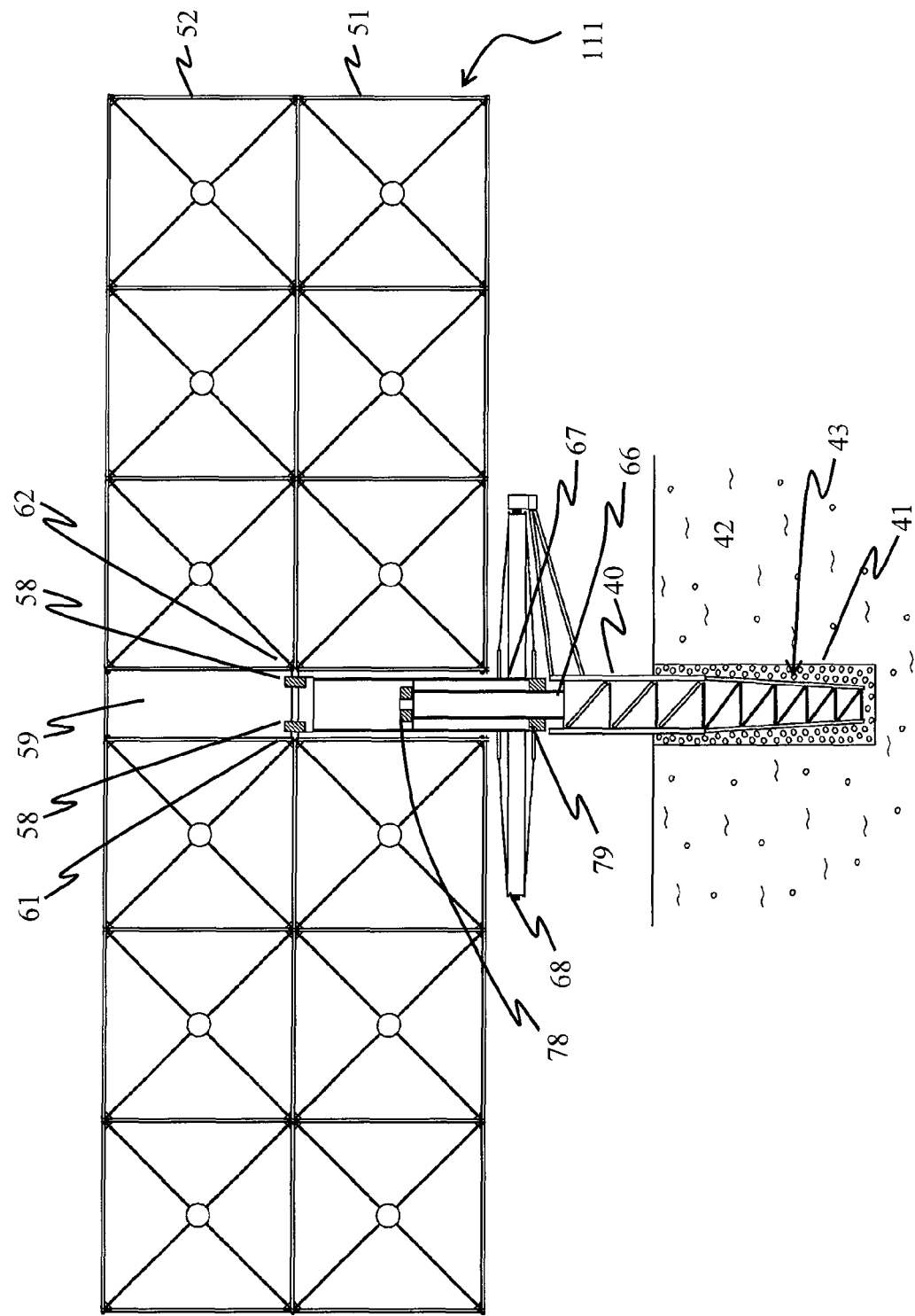
FIG. 12 shows an alternative embodiment pointing at the horizon viewed along the optic axis, showing details of an azimuth bearing and pedestal foundation.

Referring to FIG. 7, by staggering the two rows 51 and 52 of cells 34, the spaceframe 50 is naturally balanced about the elevation axis and thus efficiently supported by a central pedestal 67. Moreover, the power needed to move or rotate the rigid framework 50 in elevation is minimized. A second advantage of the staggered rows 51 and 52 of cells 34 is that the cross-section perpendicular to the rows 51 and 52 of the resulting spaceframe 50, which includes the perimeter stiffening struts 56 and 57, is maximized in two dimensions. This results in high stiffness against bending about the central bearing 58, no matter what the elevation angle may be. While the structure in this exemplar embodiment has four reflector units 34 in the upper row 52 and four reflector units 34 in the lower row 51, it will be also apparent to those skilled in the art after having the benefit of this disclosure that staggered rows of different lengths, for example two or six, might provide good results in practice, depending on the survival wind strength desired and appropriate for a given site, and depending on prevailing manufacturing costs. For example, FIG. 12 illustrates an alternative embodiment similar to that shown in FIG. 7 and FIG. 11, but with six reflector units 34 in each of two staggered rows 51 and 52.

Figure 15:
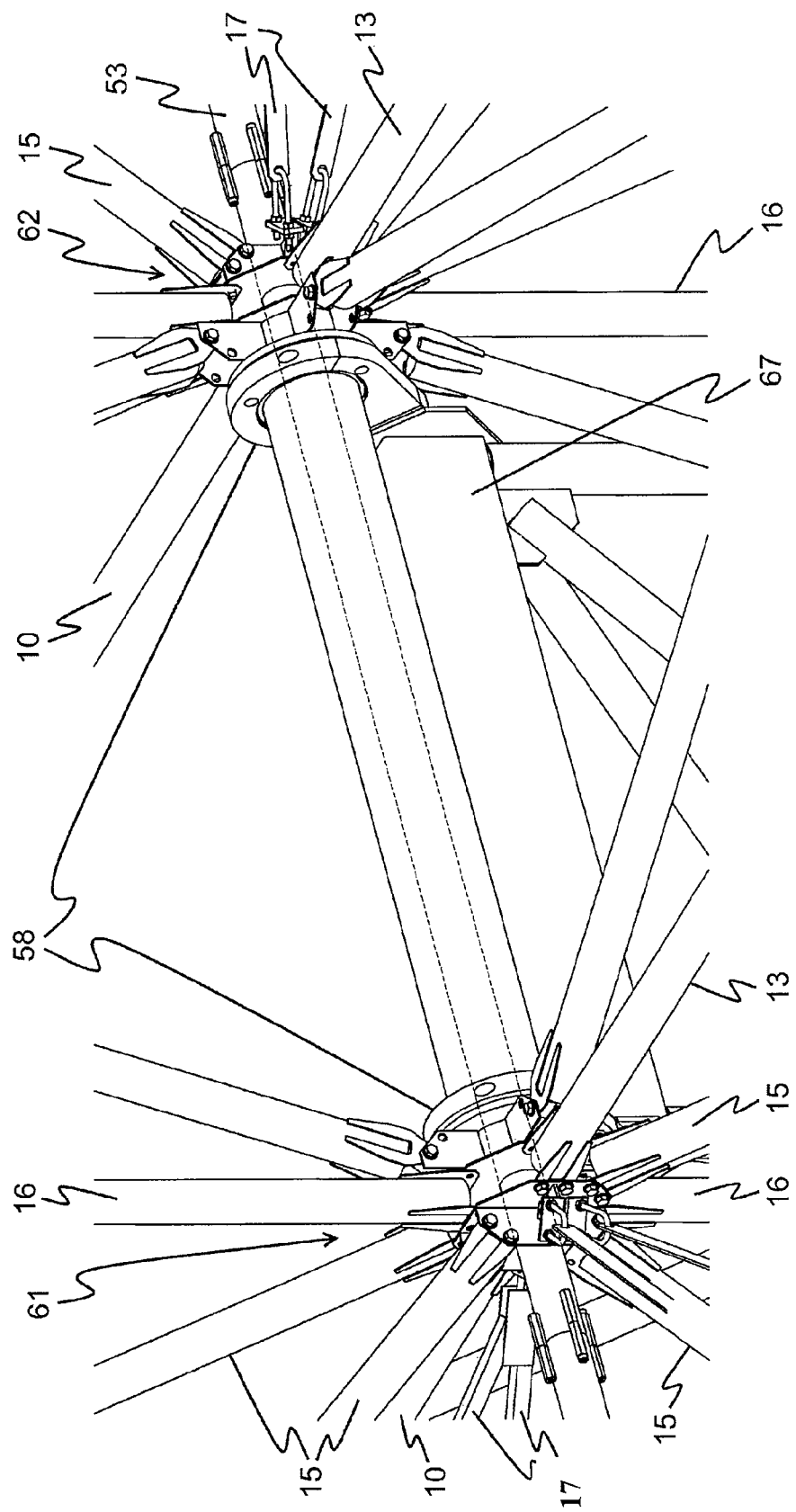
FIG. 15 is a perspective view showing details of an elevation bearing for an embodiment according to FIG. 7.

Returning to the embodiment shown in FIG. 7 and FIG. 11, the elevation axis bearing 58 in this embodiment connects to the elevation spaceframe 50 via two nodes on the central structural axis, the details of which can be better described with reference to FIG. 11. Space for the bearing 58 is created by inclusion of a narrow central cell 59 in the lower row 51 of four unit reflector cells 34, and by inclusion of a narrow central cell 60 in the upper row 52. FIG. 15 shows how high structural efficiency is achieved because stiff elevation nodes 61 and 62 that support the ends of the elevation bearing 58 are formed as an inherent part of the rigid spaceframe 50 that supports and links the reflectors 1. For clarity, FIG. 11 shows only a few of the struts supporting the elevation bearing 58. FIG. 15 shows in detail how the two ends of the elevation bearing 58 are supported at the two very stiff nodes 61 and 62 formed at the intersection of corner struts of the four inner unit reflector cells 34. No additional steel members are needed to stiffen this support 61 and 62, or to place the elevation bearing 58 at the center of gravity. Linking members 56 and 57, shown for example in FIG. 9, stiffen the two lines of cells to complete the full elevation structure that turns about the elevation bearing 58 on the central pedestal 67.

Figure 13:
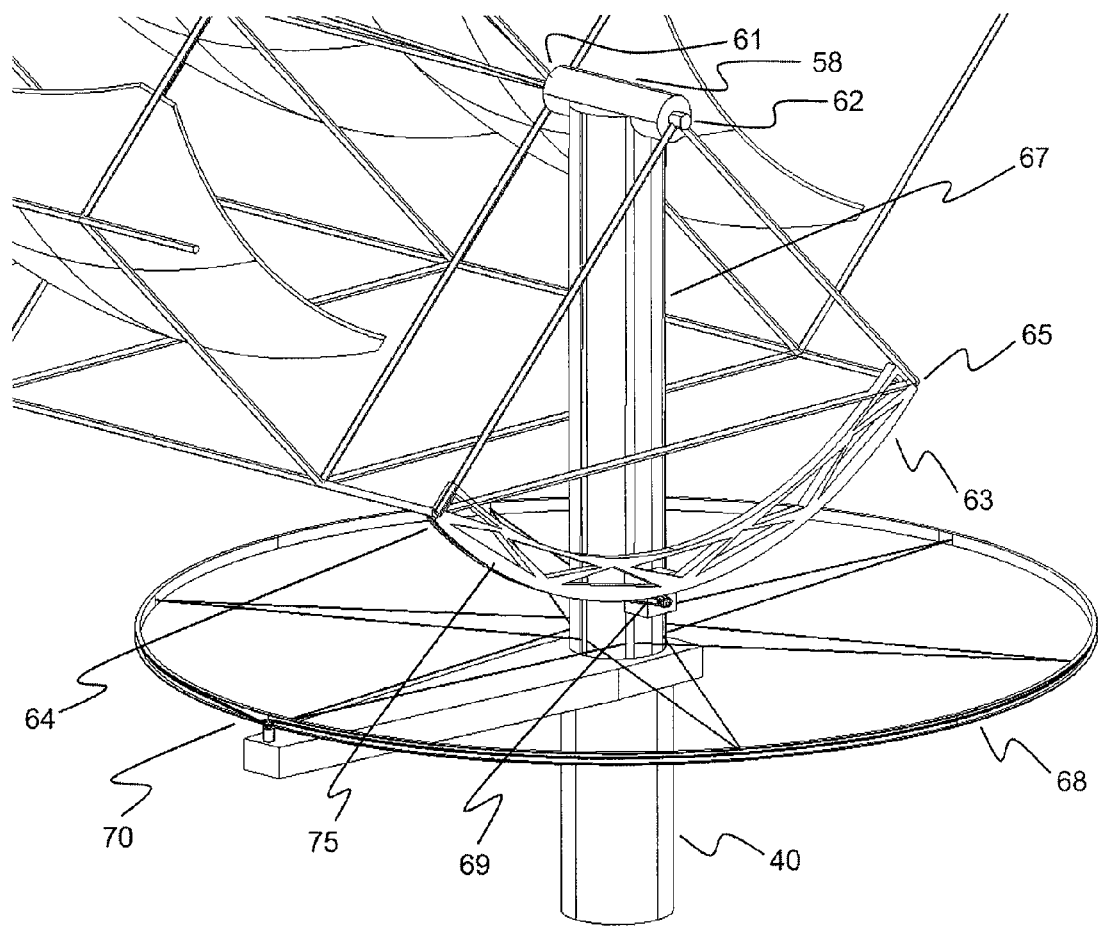
FIG. 13 is a perspective view of an embodiment according to FIG. 7 showing details of elevation and azimuth drives.

An elevation drive arc 63 is shown in FIG. 13. The elevation drive arc 63 is securely attached on one side of the narrow center cells 59 and 60 (shown in FIG. 7) from the two lower nodes 64 and 65 (shown in FIG. 9), providing for motion over a range of 90° from zenith to horizon pointing as shown by comparing FIG. 8, FIG. 9 and FIG. 10. In the illustrated embodiments, the drive arc 63 has a radius equal to the width and depth of the unit cells 34, which are the same in the illustrated embodiment.

The azimuth bearing for the embodiment shown in FIG. 7 and in FIG. 11 takes the form of a central pedestal 67 that turns about a fixed vertical shaft 66. The axial load is taken by a thrust bearing 78 positioned in the upper portion of the central pedestal 67, or at the top of the shaft 66. Lateral loads are preferably taken by two plastic journal bearings 78 and 79, one at the top and one at the bottom of the shaft 66. The azimuth drive acts through a large 360° drive wheel 68 attached to the lower end of the central pedestal 67. In the illustrated example, the drive wheel 68 is shown with the same large radius as the elevation drive. However, the present invention is not so limited, and those skilled in the art will appreciate that other radii for the drive wheel 68 can be used.

Figure 14:
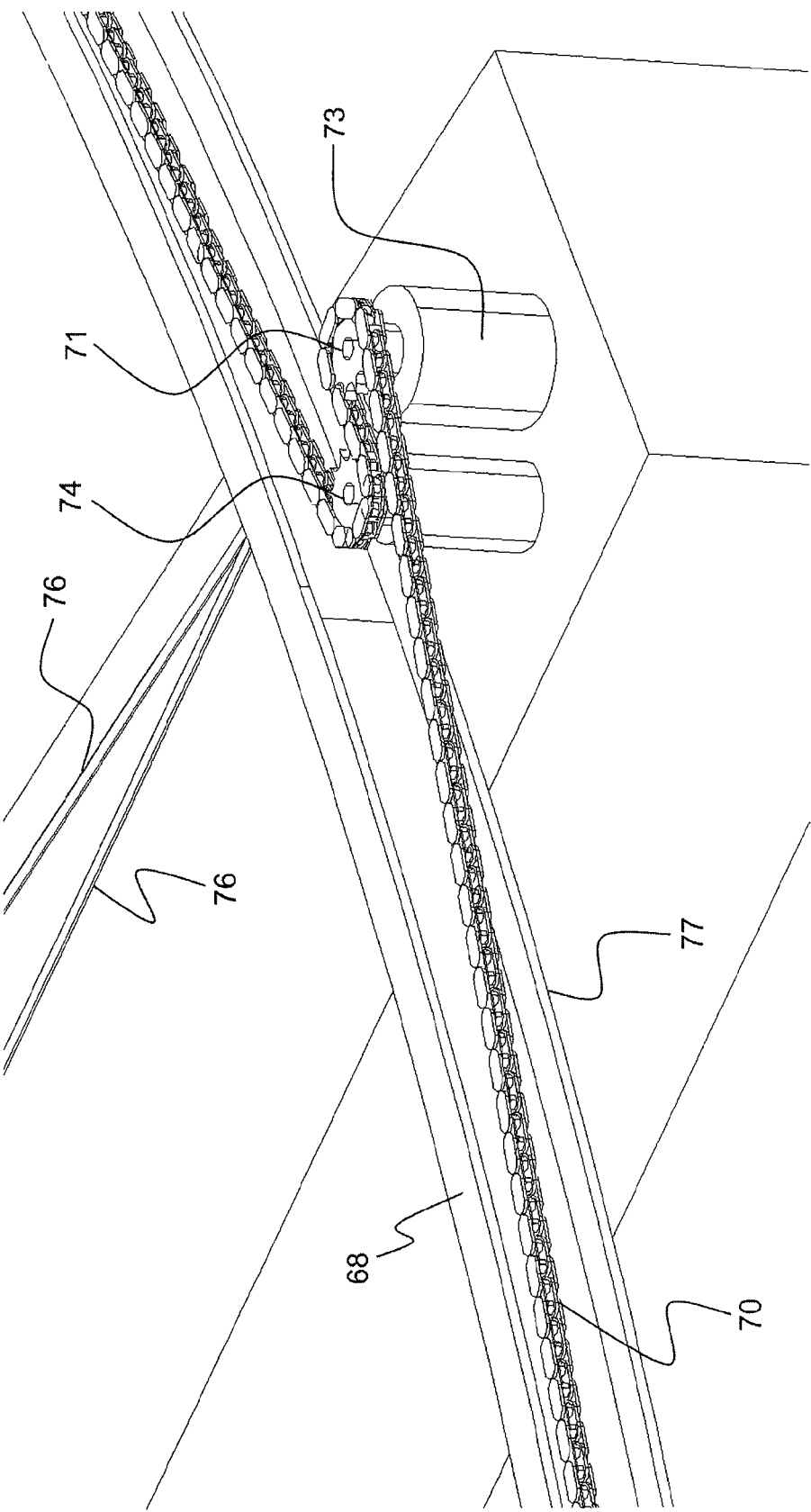
FIG. 14 is a perspective view of an embodiment according to FIG. 7 showing details of an azimuth chain drive.

Referring to FIG. 13, a preferred drive for azimuth motions in a presently preferred embodiment is by an electrically driven chain 70, which is shown in more detail in FIG. 14. In order to rotate the spaceframe 50 around the azimuth shaft 66, a drive force acts through an azimuth drive chain 70 stretched around and securely attached to the azimuth wheel 68. A rider sprocket wheel 74 may be used to adjust or maintain a desired tension in the drive chain 70. In the illustrated example shown in FIG. 14, the azimuth wheel 68 is supported by spokes 76. The elevation drive arc 63 (shown in FIG. 13) and the azimuth drive wheel 68 are preferably constructed simply and at low cost from curved structural channels 77 as illustrated in FIG. 14.

A preferred drive for elevation motions in the illustrated embodiments is by an electrically driven chain 69, as shown in FIG. 13. The drive chain 69 used for the elevation drive may be similar to the drive chain 70 used for the azimuth drive shown in FIG. 14. In the elevation drive, a drive force acts through an elevation drive chain 69 attached to the ends of the elevation arc 63, in order to rotate the spaceframe 50 around the elevation bearing 58. The elevation chain 69 is attached securely to the ends of the arc 63. The drive force is applied to the elevation drive chain 69 by a sprocket wheel turned through an electric motor and gear box, similar to the sprocket wheel 71 and electric motor and gear box 73 shown in FIG. 14 for the azimuth drive. The elevation arc 63 is supported by a small truss 75.

As shown in FIG. 14, the drive moment is applied to the azimuth drive chain 70 by a sprocket wheel 71 turned through an electric motor and gear box 73. In order to minimize the tension in the chain 70 and increase the overall gear ratio, the radius of the azimuth drive wheel 68 is made large. At least one idler sprocket 74 is needed in the chain drive, so that the engagement of the chain 70 on the drive sprocket 71 is greater than 120 degrees. In this way the wear on the chain 70, and the chance of the chain 70 slipping over the drive sprocket 71 teeth at high torque, are both reduced. In a solar energy application, the rate at which the azimuth drive and the elevation drive must be moved in order to track the movement of the sun is relatively slow, and the drive mechanism can take advantage of high mechanical ratio reductions, and allow the use of lower cost drive motors 73. Preferred mechanical ratio reductions of approximately 100 to 1 can be realized in practice, almost an order of magnitude larger than for a traditional chain drive with sprockets. Preferably the idler 74 or end of the chain 70 will be tensioned by a spring take up mechanism. Although not shown in detail, those skilled in the art will appreciate that the elevation drive chain 69 is driven by a similar arrangement, and the radius of the elevation drive arc 63 is made large for the same reasons that the azimuth drive wheel 68 is provided with a large radius. The elevation drive chain 69 is preferably tensioned by a spring take up mechanism attached to the end of the chain 69.

Taken together, the use of large arc radii for the azimuth drive wheel 68 and the elevation drive arc 63 to reduce the required drive force, together with a chain drive with engagement of many sprocket teeth 71, will result in reduced cost, complexity and size of both the azimuth drive elements and the elevation drive elements.

Figure 49:
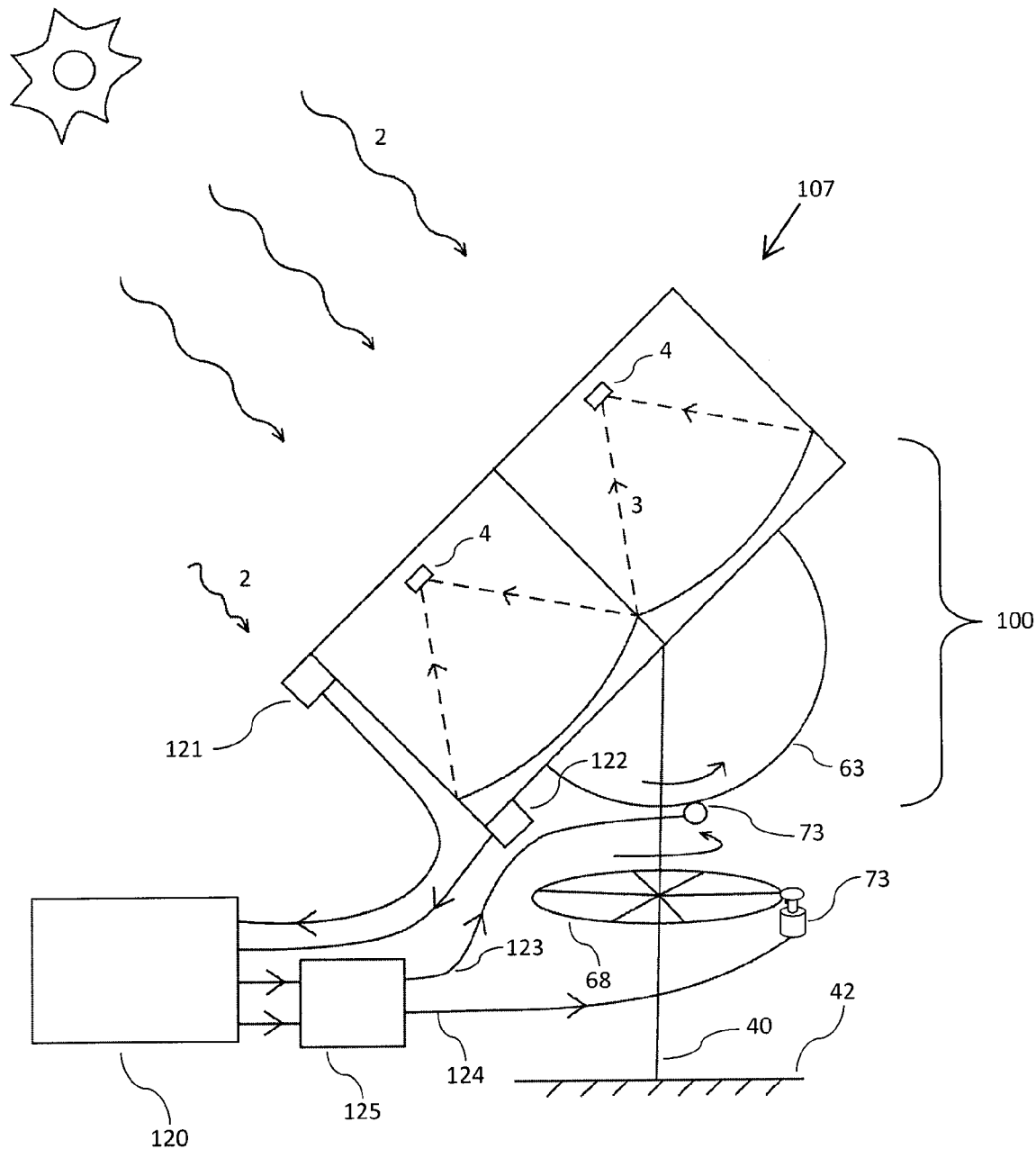
FIG. 49 is a schematic diagram of an electrical control system for a two-axis solar tracker.

During operation it is desirable to track the movement of the sun from east to west across the sky so that the rigid framework 100 is pointed in the direction of the arriving solar radiation 2. Referring to the schematic diagram of FIG. 49, precise solar pointing may be achieved if the tracker 107 is served to elevation and azimuth error signals derived from an optical sun tracking sensor 121, rigidly attached to the framework 100. A preferred form of sun tracking sensor 121 comprises a silicon quad cell illuminated by sunlight passing through a pinhole above the silicon quad cell. Preferably the orientation is sensed also by a gravitational and magnetic field sensor 122 that does not require sunlight. FIG. 49 illustrates schematically signals from sensors 121 and 122 connected to a computer 120. Drive control signals from the computer 120 are converted into drive power by an interface 125, and the electric power is carried by an azimuth cable 124 to the azimuth drive motor 73 and by an elevation cable 123 to the elevation drive motor 73.

Preferably the orientation of the framework 100 toward the sun is maintained under cloudy conditions by reference to a sensor that provides absolute pointing data from a transducer 122 that reads gravity and magnetic fields, thus avoiding errors from settling of the pedestal foundation 40, stretching of the chains 69 or 70, or bending from a strong steady wind. Alternatively, conventional telescope drive algorithms may be employed to compute the position of the sun, based upon the GPS coordinates of each individual tracker 107, and utilizing accurate time and date information provided to the computer 120. Accuracy can be improved by synching the computed position of the sun, if necessary, with the position indicated by sun tracking sensor 121 when sunlight is available, and such synchronization can effectively account for errors from settling of the pedestal foundation 40, stretching of the chains 69 or 70, or bending from a strong steady wind. Conventional computer controlled drive systems similar to conventional telescope GOTO systems may be used to point the rigid framework 100 in the correct direction and to track the movement of the sun, including encoders providing azimuth angle information and elevation angle information to the computer 120. It should be understood that the illustration shown in FIG. 49 is schematic only, and that the drive electronics may be attached to the framework 100 or elsewhere. Preferably the electric power for the azimuth and elevation drive motors 73 and active cooling systems (if any) will be furnished by an uninterruptible power source. A suitable source may be obtained by providing photovoltaic converters over the sun-facing side of the narrow center cell 60 of the upper row, which may be used in conjunction with storage batteries.

A preferred pedestal to support the azimuth bearing for this embodiment is shown in cross section in FIG. 11 and FIG. 12. The pedestal takes the form of a welded triangular steel truss 40 that extends into a hole 41, which may be drilled in the ground 42, for example, with a conventional truck mounted auger. Alternatively, the hole may be excavated by a number of conventional means known to those skilled in the art. After insertion of the truss or post 40, the hole 41 is preferably backfilled using inexpensive dry materials 43 such as crushed rock or overburden from mining without use of cement binder. The hole and truss dimensions are sized so that the dry materials will take the relative concentrated load from the truss 40 and transfer it to a much larger area of soil 42, to ensure survival in high wind. Unbonded rock is preferred instead of concrete because of its much lower cost and carbon footprint. Of course, those skilled in the art will appreciate that concrete can be used if the typically higher cost of such material can be tolerated in a particular application. Some small settling motion of the pedestal 40 is acceptable, and low accuracy in the initial placement of the pedestal 40 may be tolerated, since the tracker drive 111 will use solar tracker 121 and absolute sensors such as accelerometers and/or frequently recalibrated or synchronized sensors to position the rigid framework 100. Alternatively, those skilled in the art will appreciate that other truss foundation designs may be used without departing from the spirit and scope of the present invention.

Figure 16:
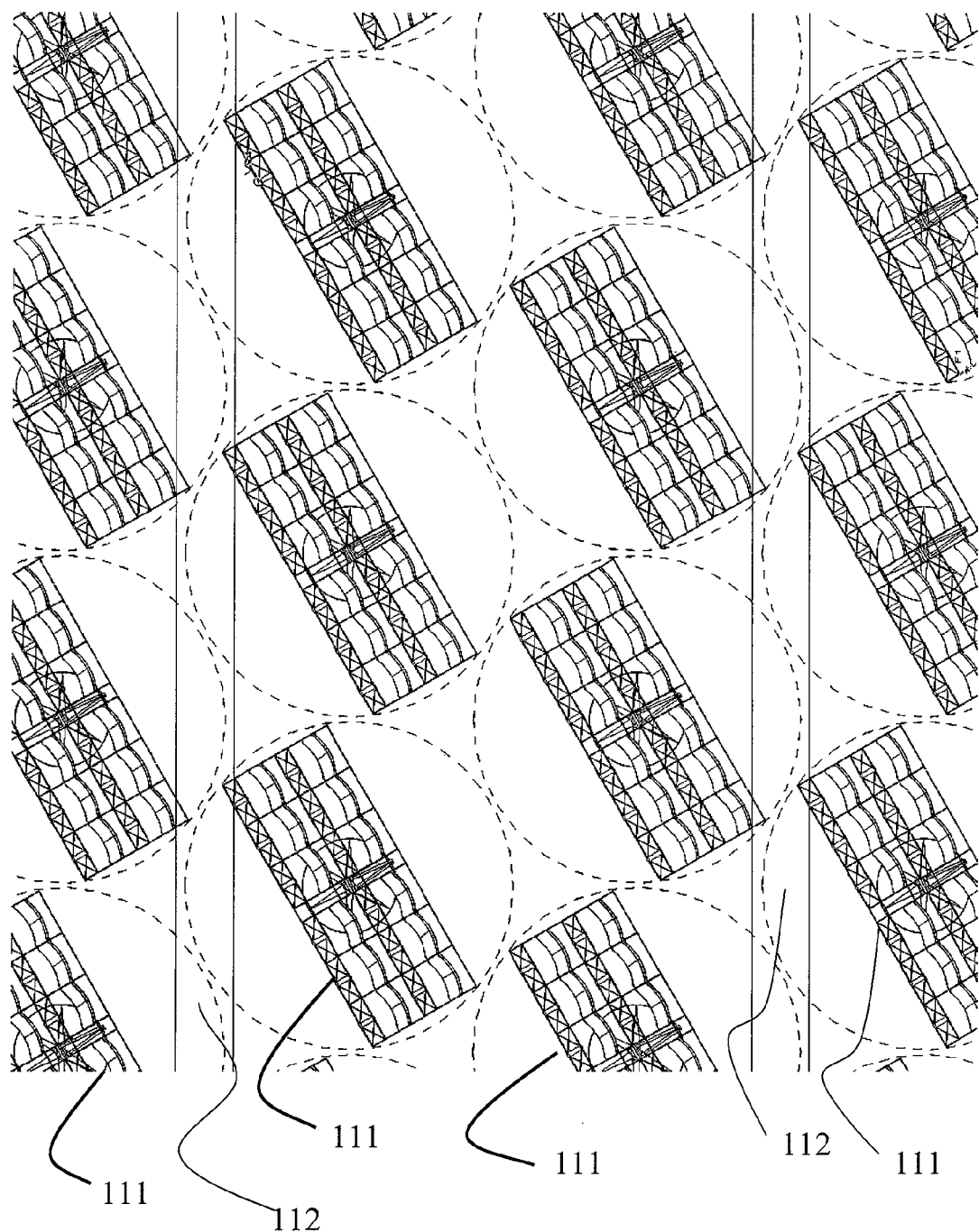
FIG. 16 is a plan view of a plurality of arrays of reflectors according to an embodiment shown in FIG. 12, in a configuration suitable for a solar farm.
Figure 17:
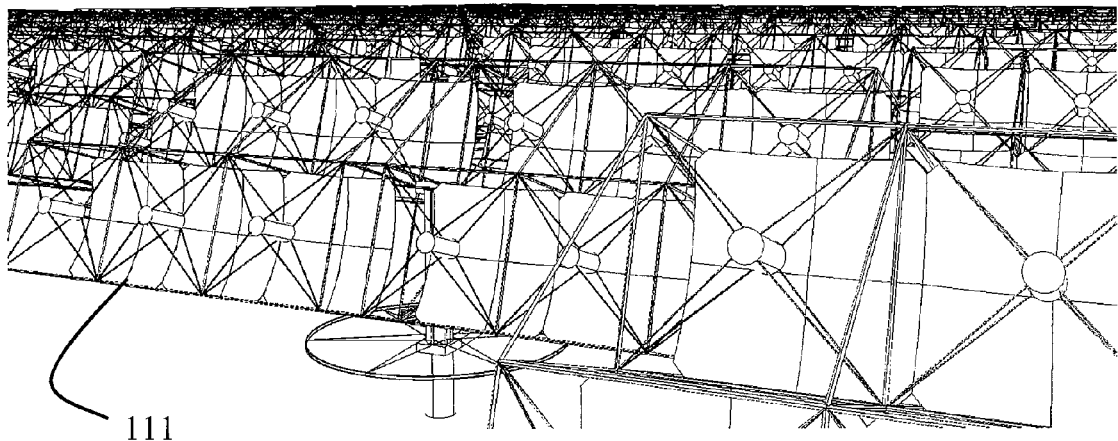
FIG. 17 is a perspective view of a plurality of arrays of reflectors according to an embodiment shown in FIG. 12, in a configuration suitable for a solar farm.
Figure 18:
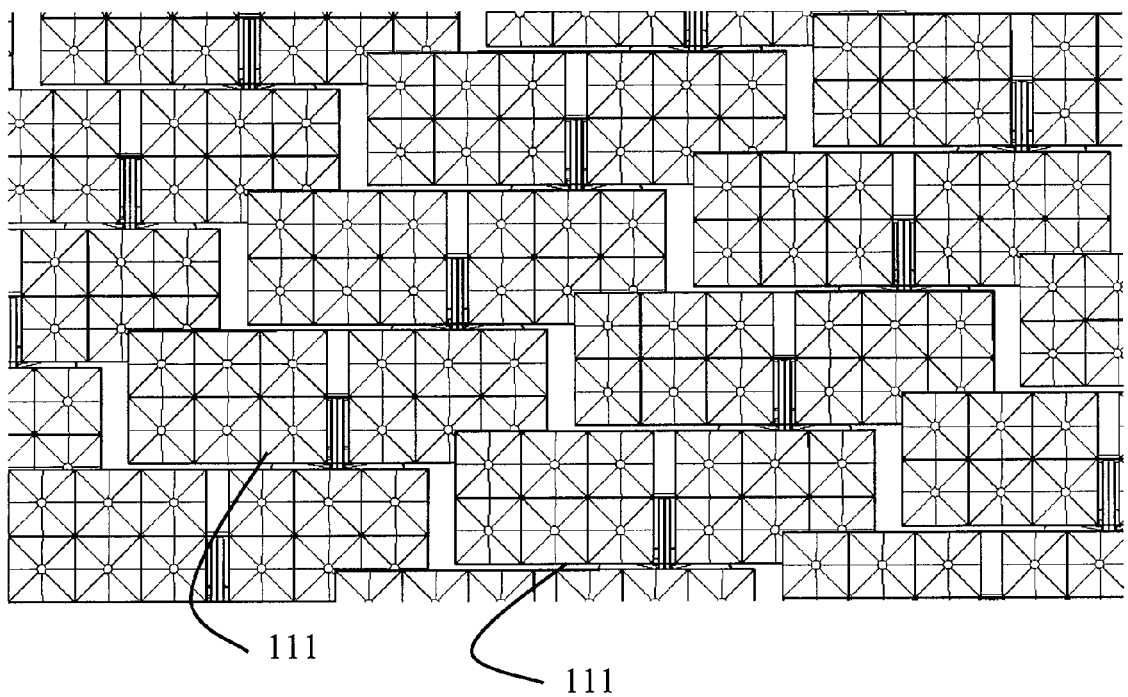
FIG. 18 is a view from the sun direction of a plurality of arrays of reflectors according to an embodiment shown in FIG. 12, in a configuration suitable for a solar farm.

FIG. 16, FIG. 17, and FIG. 18 show a preferred placement for the embodiment of the dish array 111 that is illustrated in FIG. 12. FIG. 16 shows in plan view a regular triangular grid allowing clearance for full azimuth rotation with no possibility of collision, similar to the layout illustrated in FIG. 6. The relatively small, post mounted units require very little site grading or preparation. They are advantageously suitable for installation on sloping land as well as flat land, or in irregular parcels.

Preferred Dimensions

An important consideration in the design of a preferred embodiment is the size and manufacture of the primary paraboloidal reflectors 1, especially since cost is an important factor. The present invention includes an optimization of the size of the reflectors 1. For reflectors 1 made from structural, back-silvered glass, a size of about three meters (3 m) is preferred as a generally optimum size. This size is preferred because it is the largest shippable size that can be made from a single monolith of flat glass manufactured by a conventional float process. Monolithic reflectors 1 at this size may provide the lowest cost per unit area for tracking reflector systems in accordance with the present invention.

In operation, preferably multiple dish-generator units 34 of approximately 3 m size are mounted on each tracker 107, to obtain the lowest total cost per unit area. Each square reflector 1 has a reflecting area of about 9 $m^2$. For a nominal solar flux of 1000 $W/m^2$ and reflectivity of 94%, the nominal solar power delivered to each converter unit 4 is about 8.5 kW.

Supporting structures 100 of steel for the preferred embodiments of optimal two-axis trackers 107, having 3 m glass reflectors 1 of 4 mm thick glass, should provide satisfactory performance in practice. For a twenty-seven reflector 1 embodiment, the mass of steel for the full system, including the fixed track, is 34 kg per square meter of collecting area, and the deflection a maximum of 0.1° when zenith pointing. For the eight reflector 1 embodiment, the mass of steel for the full mount 107, including the fixed pedestal, is 25 kg per square meter of collecting area, and the maximum deflection when zenith pointing is 0.06°.

Details of a Preferred Structural Design for a Unit Reflector/Converter Cell

Figure 19:
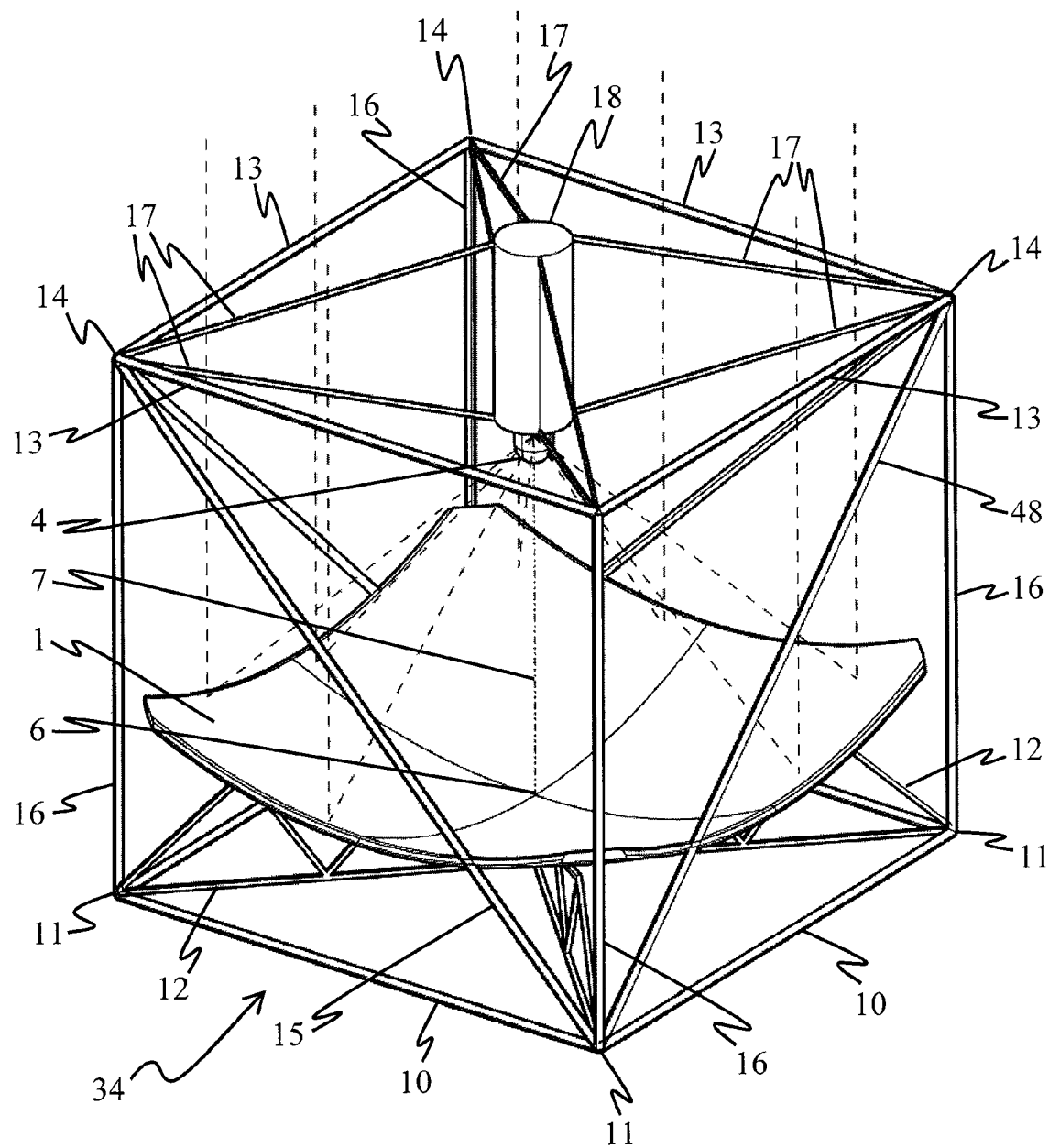
FIG. 19 is a perspective view of an embodiment of a single solar conversion unit, showing details of a structure to support a converter unit above a square reflector.
Figure 20:
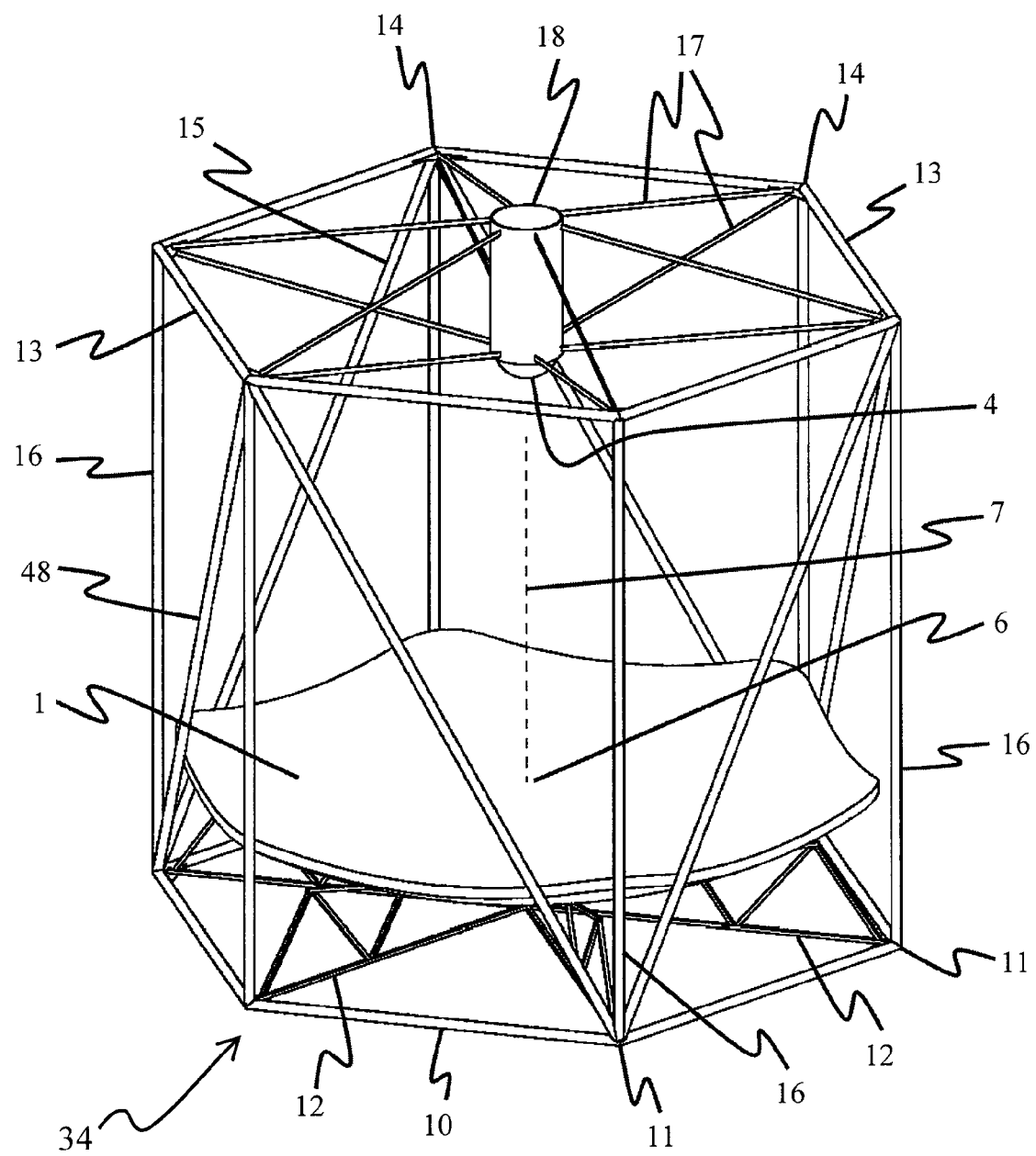
FIG. 20 is a perspective view of an alternative embodiment of a single solar conversion unit, showing details of an alternative structure supporting a converter unit above a hexagonal reflector.

The preferred embodiments of the invention use, as building blocks, a plurality of unit reflector cells 34. The unit reflector cells 34 comprise a reflecting dish 1 to direct energy to the focal region 28 and a mechanical structure to support the dish 1 and to hold the converter unit 4 in rigid alignment near the focal region 28. A major element of the mechanical structure is a truss in the form of a right prism whose cross section and end faces are preferably square or hexagonal, as illustrated in FIG. 19 and FIG. 20. FIG. 19 shows a unit cell 34 with square cross section, as adopted in a preferred embodiment described above, and FIG. 20 shows an alternative unit cell 34 having a hexagonal cross section. A substantially square (FIG. 19) or hexagonal (FIG. 20) dished mirror 1 is supported from the corners 11 of the lower prism face by a dish support structure, described below. The dish axis 7 passes through the dish center or vertex 6. A compact converter 4 that obscures only a small fraction of the primary collector is located above, centered on the dish axis 7, and supported from the upper corners 14 of the upper prism face formed by members 13. The upper face is of the same size as that formed by members 10, and is parallel to it. Both the upper and lower face centers lie on the dish axis 7. The converter 4 is centered on the dish axis 7, and is preferably supported at the lower end of a central axial converter support member 18. The converter support member 18 is preferably supported by diagonal tension elements 17 from the upper corners 14. Four (FIG. 19) or six (FIG. 20) perpendicular elements 16 link the upper and lower squares. Preferably the side faces of the prism are braced by diagonal elements 48. The glass support truss 12 closes the bottom side of the structure as well as supporting the primary paraboloidal reflector 1.

The concentric placement of the converter support 18 is appropriate for embodiments in which waste heat is removed by actively pumped cooling liquid, rather than passively by a thermosiphon 24. In an active cooling system, the cooling liquid is circulated through a heat exchanger which may be located directly above the generator 4 in FIG. 19 or FIG. 20, or at another location that does not obscure the incoming sunlight, reached by pipes along the diagonal supports 17 and 18.

The most preferred embodiment of the reflector dish 1 is a single, slumped, back-silvered reflector of float glass attached to an open steel truss. A cradle of well spaced upper nodes of the truss holds the shape of the glass reflector 1 on large spatial scales against gravity and wind forces, through bonded pads. The lower nodes transfer the load to the lower corners 11 of a unit cell 34 of the main elevation framework 100.

The glass support truss 12 linking the silvered glass reflectors 1 to the corner supports 11 is optimized in accordance with the size, shape and thickness of the glass reflector 1 in any given embodiment. The thickness of glass 1 is determined in large measure by the need to resist hail damage. Four mm thick back-silvered meter-sized panels on four support pads used in trough thermal systems have given satisfactory results in practice. For the larger reflector dishes 1 of this invention, glass reflectors 1 having a thickness of about 4 mm thickness require a larger number of supports, optimally distributed so that bending under gravity and wind forces does not significantly degrade the optical figure. Preferably, support points that are part of a large, deep open truss are used for glass reflectors 1, providing maximum overall stiffness for minimum mass and material cost.

Figure 21:
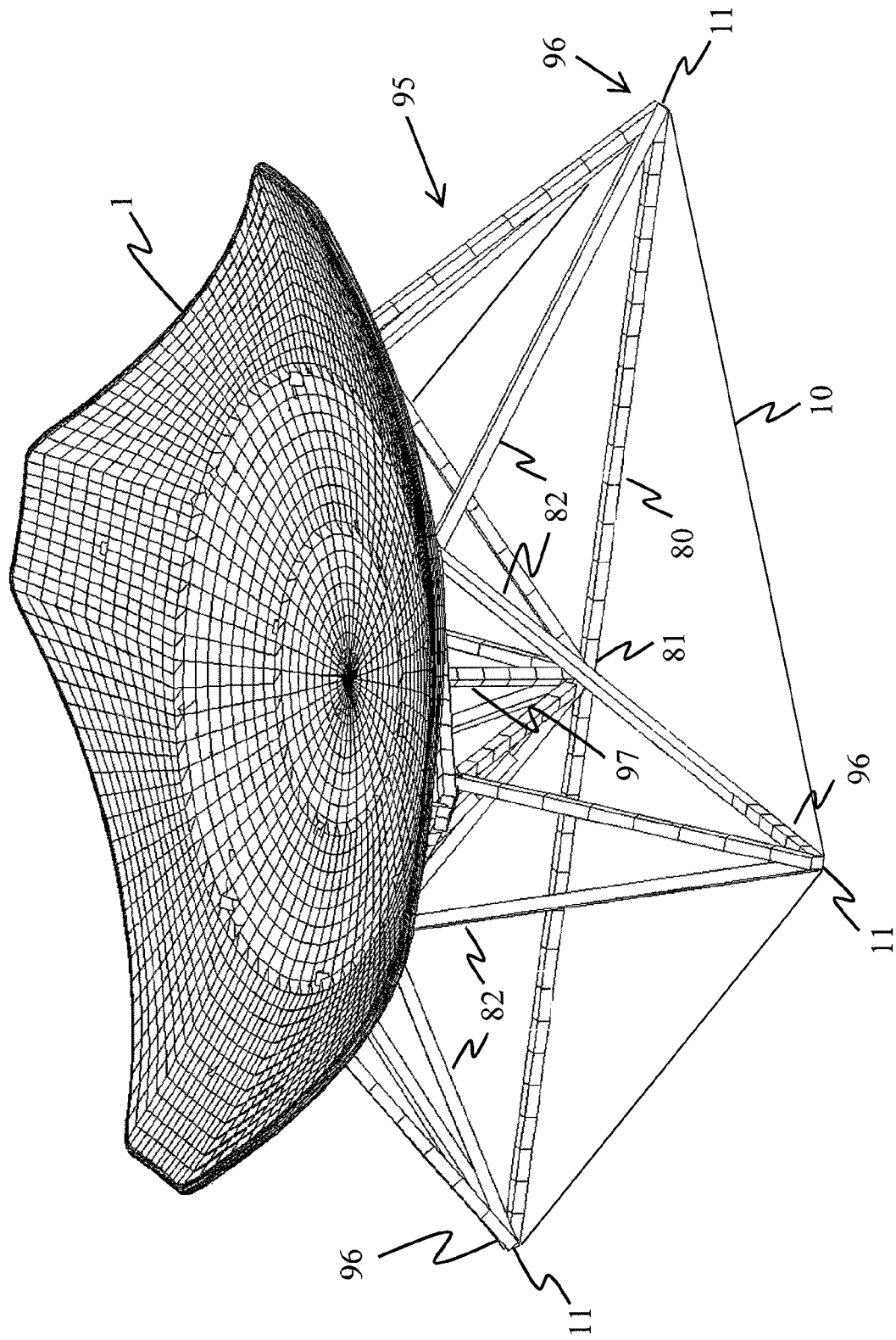
FIG. 21 is a perspective view of a preferred embodiment of a reflector unit for use in a solar conversion unit according to one embodiment of the invention, showing a glass reflector and its supporting structure.
Figure 22:
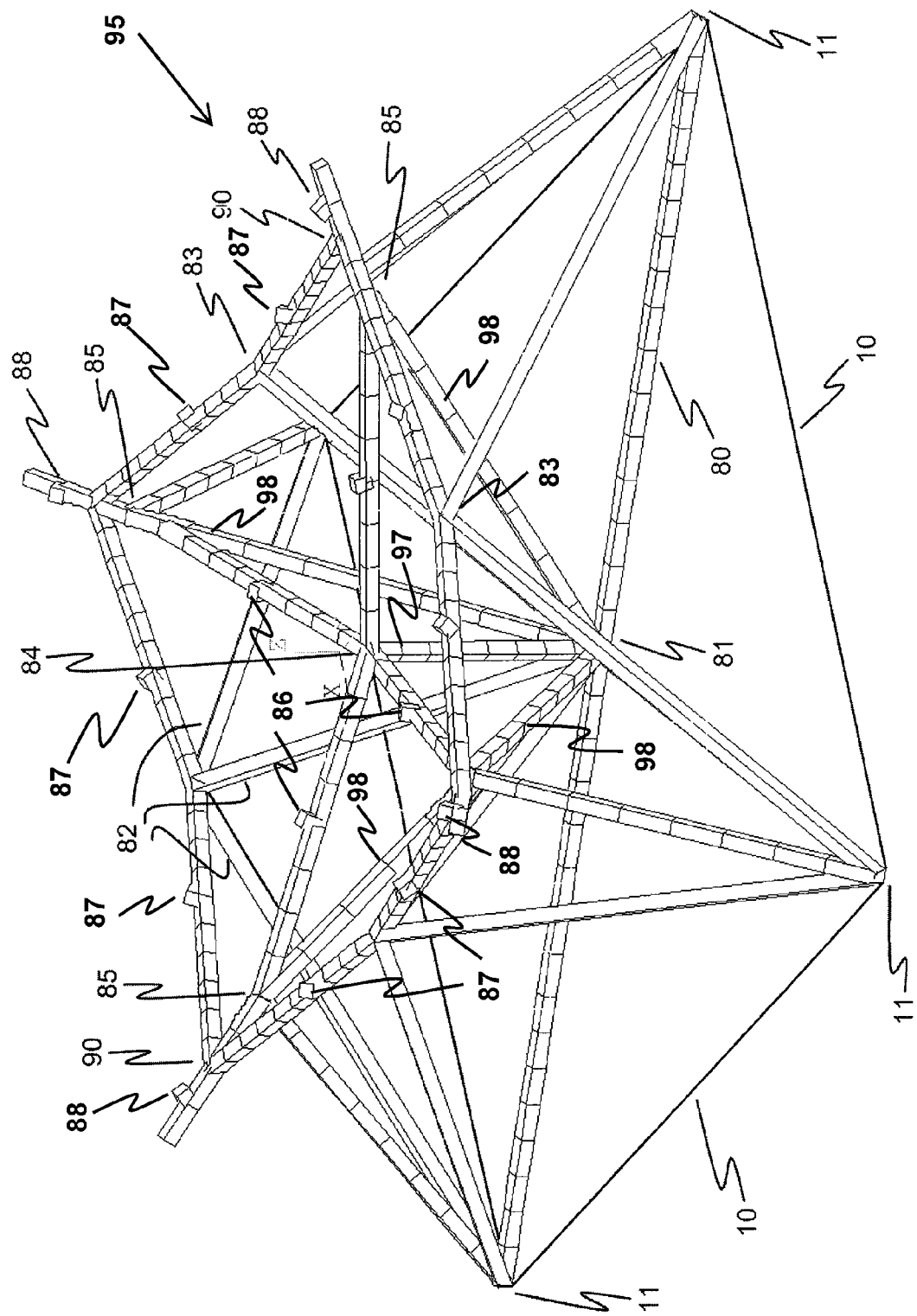
FIG. 22 is a perspective view of supporting structure for a monolithic glass reflector according to the embodiment illustrated in FIG. 21, showing the supporting struts and nodes with the glass reflector removed.
Figure 23:
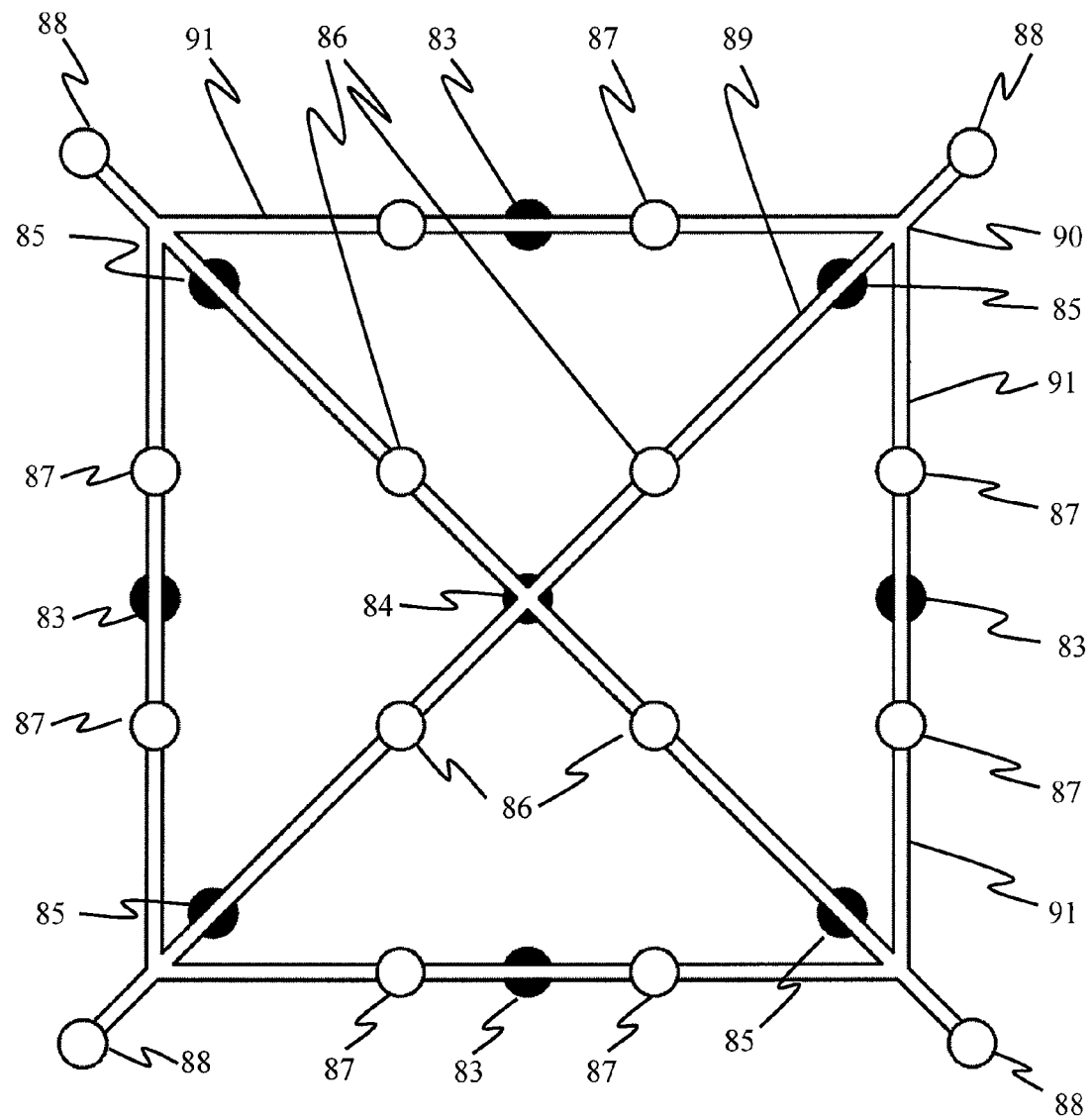
FIG. 23 is a plan view of supporting structure for a monolithic glass reflector according to the embodiment illustrated in FIG. 21, showing details of the cradle of support points and the uppermost supporting struts and nodes shown in FIG. 22.

A preferred integrated reflector design, shown in FIG. 21, comprises a substantially square, back-silvered glass reflector 1 and supporting reflector framework. FIG. 22 is a detailed perspective view to show the reflector framework or truss 95 with the glass reflector 1 removed, revealing the sixteen reflector support points 86, 87 & 88 cradling the glass reflector 1. In plan view FIG. 23, these form a roughly square Cartesian grid in a four-by-four pattern. The reflector truss 95 is designed for attachment at its base 96 to the four lower corner points 11 of a unit reflector cell 34. The four base struts 10 of the unit cell 34 combine with two base diagonals 80 that meet at a base center 81, to form four triangles in base plane. Three angled struts 82 are erected from the corners of each said triangle to form four tetrahedra whose upper nodes 83 are main nodes forming a cradle for the glass reflector 1. The five other main upper nodes 84 and 85 are formed at the corners of two planar frameworks extending up from the base diagonals 80 and sharing the common central member 97 connecting 81 and 84, perpendicular to the base plane. These two orthogonal frameworks are braced by four diagonal members 98 connecting the base center 81 to upper nodes 85. FIG. 23 is a plan view detailing just the upper structure of truck beams and mirror supports 86, 87 & 88. The sixteen cradle support points comprise four inner supports 86, eight intermediate supports 87 and four outer corner supports 88. The inner four and outer four cradle points, 86 and 88 respectively, lie on cradle struts 89 extending through nodes 84, 85 and 90. The nodes 83 and 90 at the ends of struts 91 carry the intermediate supports 87.

Figure 24:
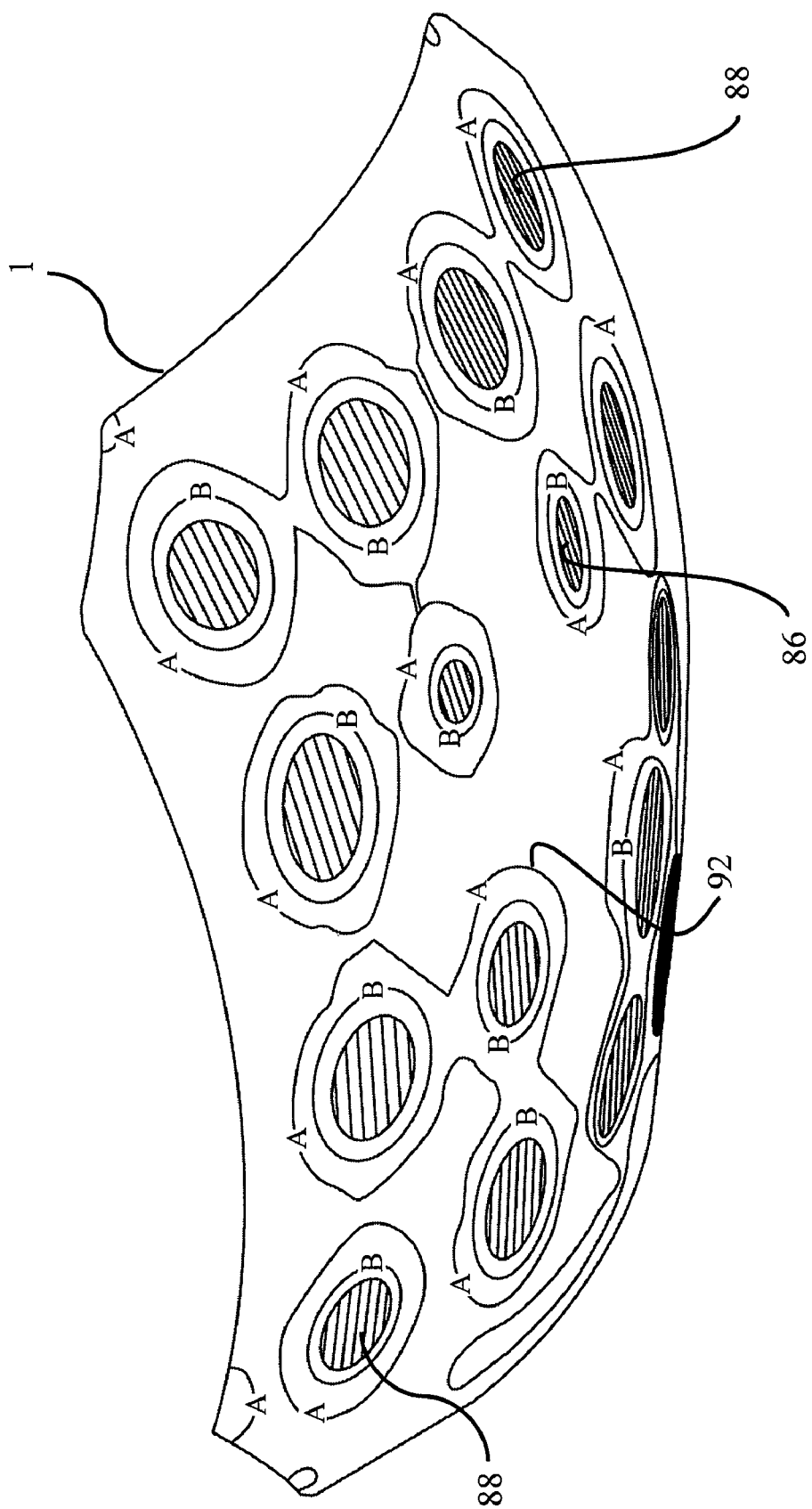
FIG. 24 is a perspective view of a contour map for a calculated deflection under an axial one g gravity load for 4 mm thickness, showing the change in slope angle across the surface of a glass reflector caused by the loading slope deviation.

FIG. 24 shows the deflection of a glass reflector 1 supported by the preferred framework illustrated in FIG. 21, FIG. 22 and FIG. 23, as calculated by finite element analysis. Deflections were calculated for a 3.3 m square paraboloidal reflector 1 with a 1.7 m focal length. The glass 1 is 4 mm thick and has edges rolled back through 90 degrees with a 25 mm radius. The supporting truss was modeled with a central depth of 0.6 m, with struts made from round steel tubes of two-inch diameter and 0.015 inch wall thickness. Other cross sections could work as well, provided their cross sectional area and moment of inertia are similar. Referring to FIG. 24, the truss weight for the calculated example averages 3.5 kg per square meter of glass supported. This areal density of steel is significantly less than the glass areal density of 10.1 kg/m$^2$ for 4 mm thickness. The average weight for a complete 3 m reflector assembly is thus 13.6 kg/m$^2$ for 4 mm thick glass. The deflection under the axial gravity load (or equivalently a 30 mph normal wind load) calculated for this example is illustrated in FIG. 24. The contour map across the surface shows the change in slope angle caused by the loading. FIG. 24 shows contour lines 92 that have slope deviations of 0.05 radians. The deviations in slope, caused largely by shear deflections in the vicinity of the support pads, over most of the surface amount to less than 0.1 milliradians, the level marked by contour B. Contour A corresponds to slope deviation of 0.05 radians. Averaged over the entire surface, 90% of collimated light reflected by the dish falls within an image of diameter 0.2 degrees, while all the light lies within a 0.4 degree diameter.

Figure 25:
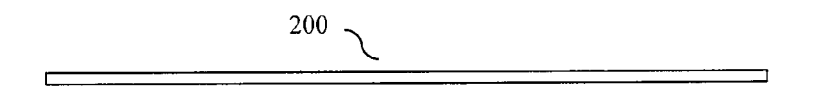
FIG. 25 is a cross sectional view of a piece of flat glass to be shaped into a reflector for use in the embodiments illustrated in FIG. 1 and FIG. 7.
Figure 26:
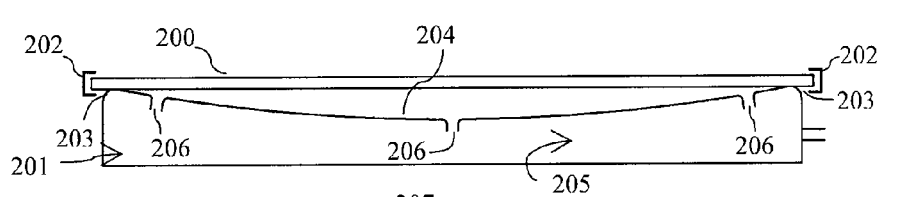
FIG. 26 is a cross sectional view of the piece of glass according to FIG. 25, placed on a mold.
Figure 27:
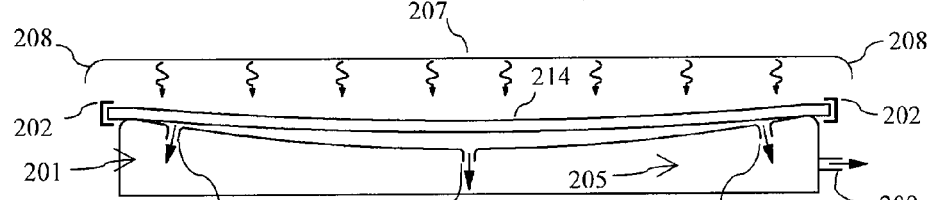
FIG. 27 is a cross sectional view of a piece of glass after the step shown in FIG. 26, where the piece of glass has been softened by radiatively transferred heat and partly shaped to the mold.
Figure 29:
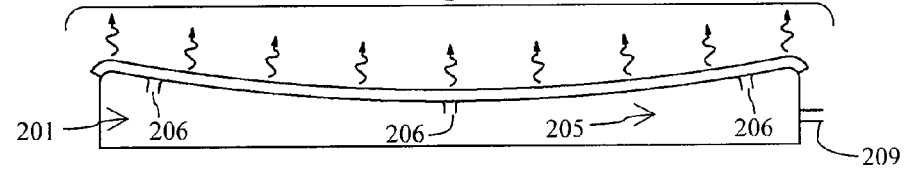
FIG. 29 is a cross sectional view of a molded piece of glass after the step shown in FIG. 28, where the piece of glass is being cooled by radiative transfer.
Figure 30:
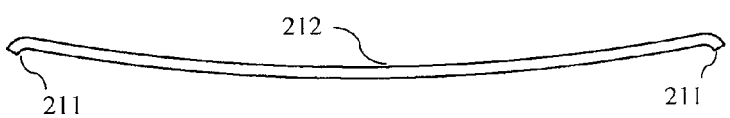
FIG. 30 is a cross sectional view of the molded piece of glass according to FIG. 29, where the molded piece of glass has been removed from the mold.
Figures 31, 32:
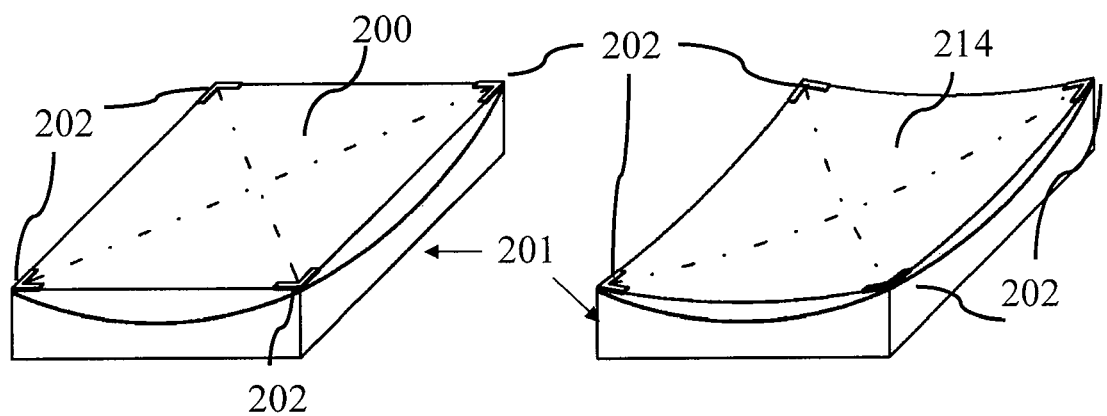
FIG. 31 is a perspective view showing a square mold with a flat sheet of glass held above the mold.
FIG. 32 is a perspective view showing a square mold with a partially curved sheet of glass suspended above the mold.

A Preferred Method of Manufacture for a Large, Monolithic and Deeply Dished Glass Reflector A preferred sequence of process operations to produce a concave monolithic reflector 1 by shaping an initially flat sheet of glass is illustrated schematically in sequence in FIG. 25, FIG. 26, FIG. 27, FIG. 28, FIG. 29 and FIG. 30. The process operations are also illustrated in perspective in the sequence of FIG. 31, FIG. 32, FIG. 33 and FIG. 34. FIG. 25 shows a sheet of glass 200, which is flat at the start of the process. FIG. 26 and FIG. 31 show the flat sheet 200 after placement above a mold 201. A mold 201 has a substantially concave surface 204 and rolled edges 203. The glass sheet 200 is supported initially above the mold 201 from its corners, which are grasped temporarily by hinged, L-shaped supports 202. FIG. 27 and FIG. 32 illustrate the beginning of a softening and stretching step. The temperature of the sheet of glass 214 is increased preferably by radiative heating from a hot surface 207 above the sheet of glass 214. Preferably the radiative surface 207 is substantially continuous and has high emissivity. Preferably the radiation temperature seen by the glass 214 can be rapidly increased or decreased, either by using a variable temperature radiator 207 of low thermal inertia, or by providing relative motion between the mold 201 and radiating surfaces 207 of different temperatures. Preferably the temperature can also be varied as a function of spatial position across the mold 201, for example, a higher temperature is provided around the edges 208 of the radiating surface 207 as compared to temperature of the central region of the radiating surface 207, in order to make the edges 211 of the glass sheet 214 softer than the center of the glass sheet 214. While gravitational force may be used exclusively to drive the shaping of the glass sheet 200 into a concave dish 212, the process of conforming the sheet of glass 200 to the shape 212 of the mold 201 may be accelerated by pressure, for example by hot gas jets directed from above, or by a pressure differential created in another fashion, such as with a vacuum pump.

Figure 28:
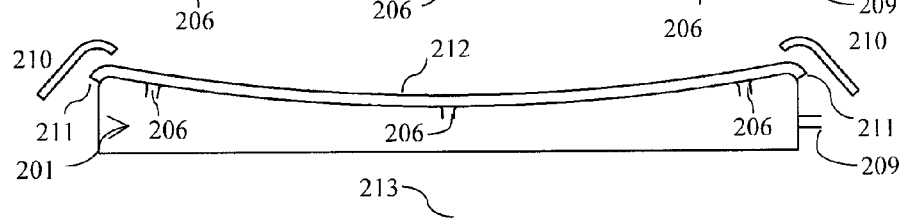
FIG. 28 is a cross sectional view of a piece of glass after the step shown in FIG. 27, where the piece of glass has been fully conformed to the mold shape.
Figures 33, 34:
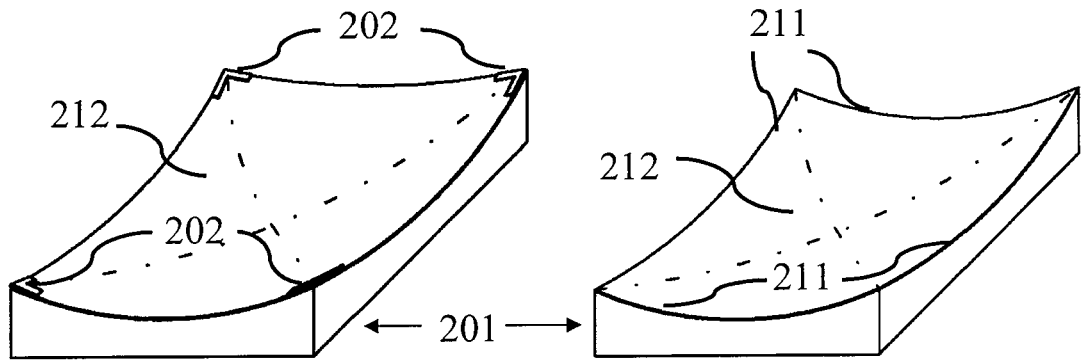
FIG. 33 is a perspective view showing a square mold with a fully formed sheet of glass resting on the mold, with corner supports still in place.
FIG. 34 is a perspective view showing a square mold with a fully formed sheet of glass resting on the mold and corner supports removed.

When the glass sheet 212 has sagged enough to make extensive contact along the edges or sides 203 of the mold 201, as shown in FIG. 33, and the glass 212 having a shape illustrated in FIG. 28, the corner supports 202 may be removed, as shown in FIG. 34. At this stage, edge-shaping tools 210 may be brought into mechanical contact with the outer edges 211 of the glass sheet 212 to press and curve the glass edges 211 to a desired rolled shape, as shown in FIG. 28. Also, once the glass sheet 214 has conformed and sealed against the curved perimeter 203 of the mold 201 as shown in FIG. 27, it may be desirable to hasten or otherwise control shaping the sagging glass sheet 214 into a dish shape 212 by reducing the air pressure below the mold 201. For this purpose, the mold 201 may be constructed as shown in FIG. 27, with a vacuum manifold 205 beneath, and having holes 206 in the surface in fluid communication with the manifold 205. The shaping process may then be accelerated by reducing the pressure in the manifold 205 by drawing air down through the holes 206 and out through the vent 209 by pumping.

Once the glass 212 has made contact across the body of the mold 201 and its edges 203, thus taking on the mold shape, rapid cooling is started. FIG. 29 illustrates the process, accomplished by radiation from the upper surface of the glass 212 into an absorbent, black surface 213, now much colder than the surface of the glass 212. Forced convection of cool air across the surface of the glass 212 may also be used to speed the cooling step. Once the glass 212 has cooled sufficiently to be stiff enough for short-term handling, it is preferably removed from the mold 201 as shown in FIG. 30 for annealing and cooling, leaving the mold 201 clear for the next piece of glass 200 to be shaped. The glass piece 212 may then be cooled to room temperature at an accelerated rate by forced air convection.

Figure 35:
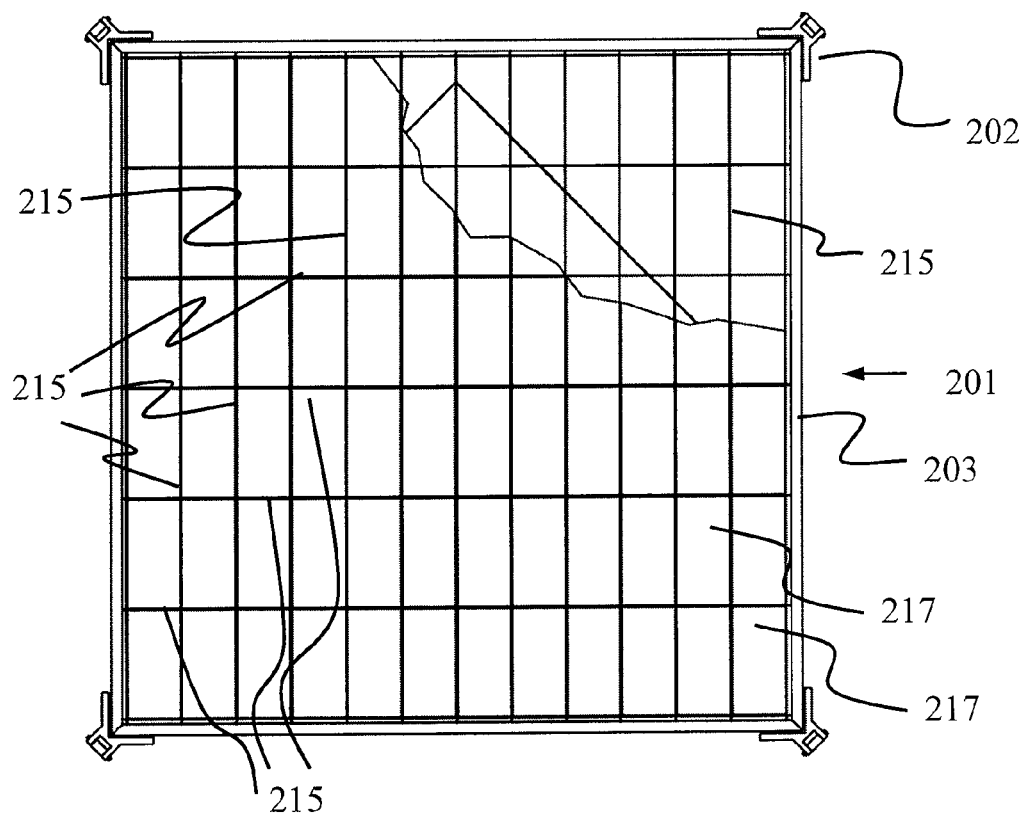
FIG. 35 is a partially cutaway plan view of a square mold showing the underlying supporting framework and corner supports.
Figure 36:
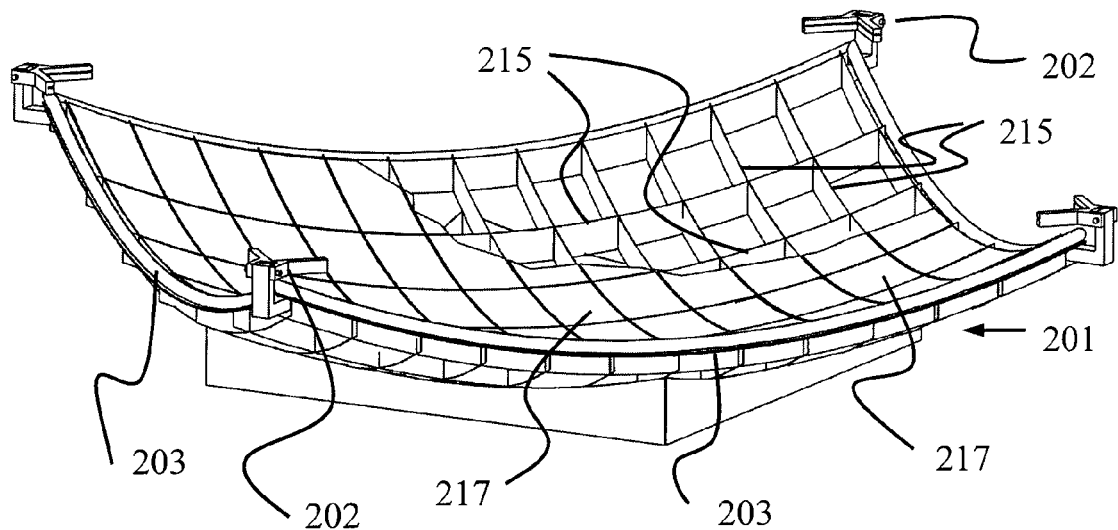
FIG. 36 is a partially cutaway perspective view of a square mold showing corner supports and some front panels attached.

A mold 201 may be constructed with an underlying structural framework shown in plan view in FIG. 35, with a mosaic overlay of precision machined plates which make the shaping surface as shown in the perspective cutaway view of FIG. 36. A preferred material for the mold 201 is AISI 304 stainless steel. An egg-crate style structural framework 215 for a square mold 201, illustrated in FIG. 35, is made from a slotted and interlocking array of identically shaped plates 215 welded together at junction nodes for strength and rigidity. The mold perimeter 203, over which the edges of the glass sheet 200 will be rolled, is preferably made from round tube and welded to the structural framework 215. The tube radius is chosen to be the radius of the rolled edge 211 to be molded. The perimeter tube 203 may have square corners as shown or clipped corners to produce a glass reflector 1 as shown in FIG. 4. Referring to FIG. 35 and FIG. 36, the overlay molding surface 217 may be assembled from a plurality of separately machined and strain-relieved segments 217, rigidly attached to the supporting egg-crate structure 215. Alternatively, a mold face may be formed in one piece from a spun or hydroformed monolithic dish, machined as a single piece. This piece may be strain-relived and re-machined as required, before mounting on a supporting framework 215 like that shown in FIG. 35. The segments 217 or the monolithic single piece of the mold dish may be attached to the framework 215 by supports that take the form of positioning devices (not illustrated). These devices are used to bring the segments into alignment, with the aid of a metrology device such as laser tracker, not shown.

Figure 37:
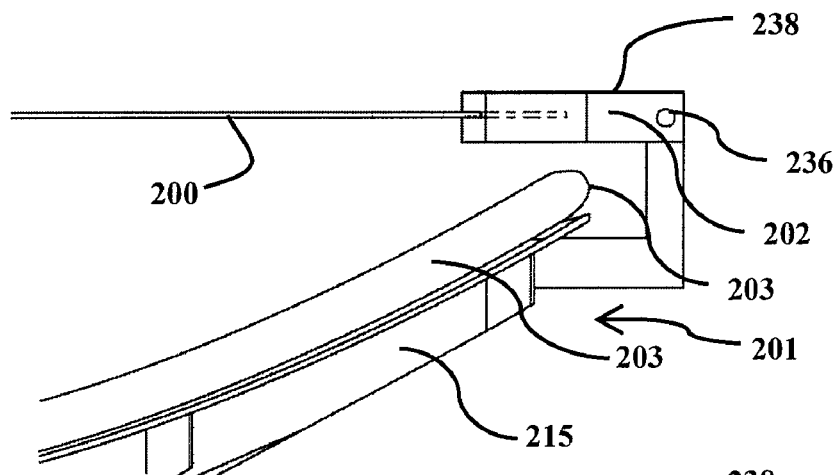
FIG. 37 is a cross sectional detail view of a corner support holding a flat sheet of glass prior to shaping.
Figure 38:
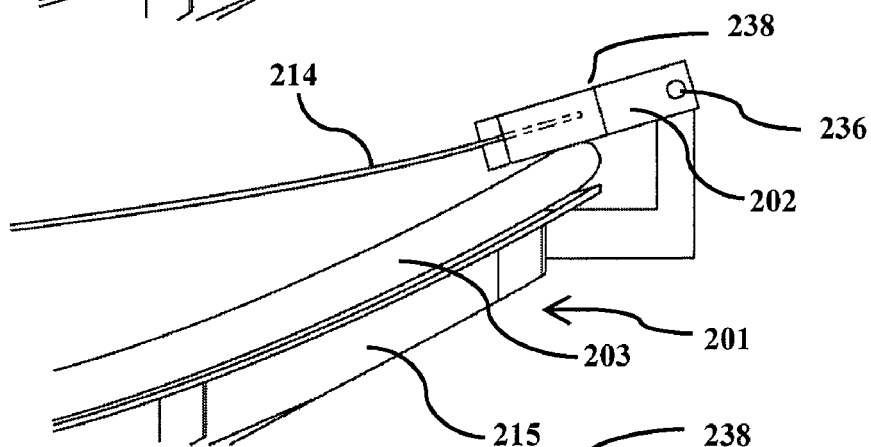
FIG. 38 is a cross sectional detail view of a corner support holding a partially formed sheet of glass.
Figure 39:
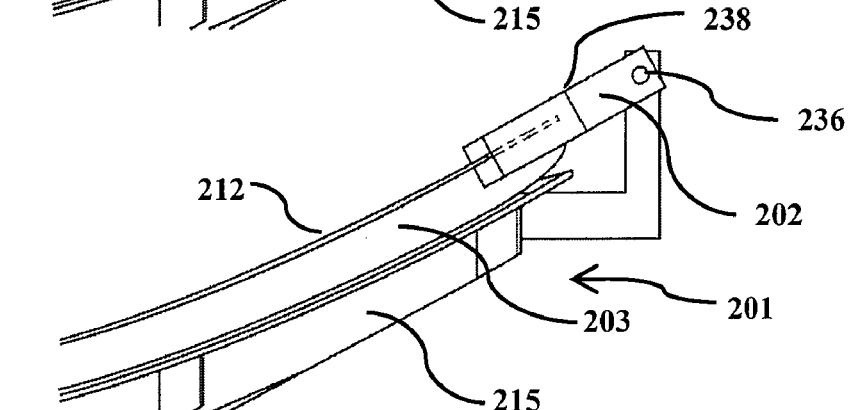
FIG. 39 is a cross sectional detail view of a corner support holding a dished sheet of glass resting on the mold with the corner supports still in place.
Figure 40:
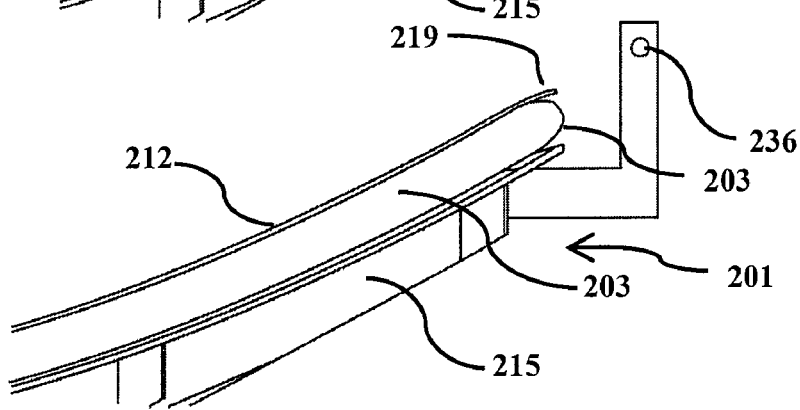
FIG. 40 is a cross sectional detail view of a dished sheet of glass resting on the mold with the corner supports removed.

FIG. 37, FIG. 38, FIG. 39 and FIG. 40 together illustrate the action of the corner supports 202, which are hinged about a horizontal axis 236 perpendicular to the reflector axis, so they can swing down but not move radially inwards. This method of restraint ensures that as the sheet of glass 214 softens and sags, the glass 214 will stretch, thus avoiding the tendency of a simply-supported sheet 200 to wrinkle by compressive hoop buckling strains when sagged into a deep dish 212. Details of the corner supports 202 and their operation may be described with reference to FIG. 37, FIG. 38, FIG. 39 and FIG. 40, all of which show vertical cross sections taken along a diagonal through the supports. FIG. 37 shows the corner support 202 prior to softening of the glass sheet 200. The support comprises a bracket attached to the mold 201 and a hinged, L-shaped piece 238 that grips a corner of the glass 200 and turns about a hinge 236. FIG. 37 shows a substantially flat sheet of glass 200 in position in the hinged piece 238. FIG. 38 illustrates the support 202 when the glass 214 is partially sagged and stretched. FIG. 39 shows the glass 212 when fully sagged and stretched and touching the full body of the mold 201, with the support 202 still in place. FIG. 40 shows the conforming glass 212 following the removal of the gripping L-shaped piece 238 of the support 202. The softened edge 219 of the glass 212 is beginning to bend over the curved edge 203 of the mold 201.

Figure 41:
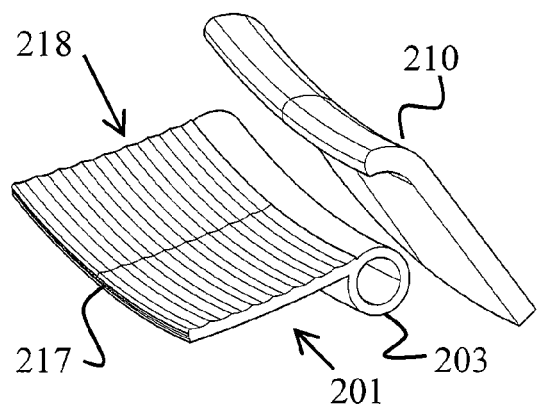
FIG. 41 is a partially cutaway perspective view detailing a section at the edge of a mold, with a forming tool positioned above the mold.
Figure 42:
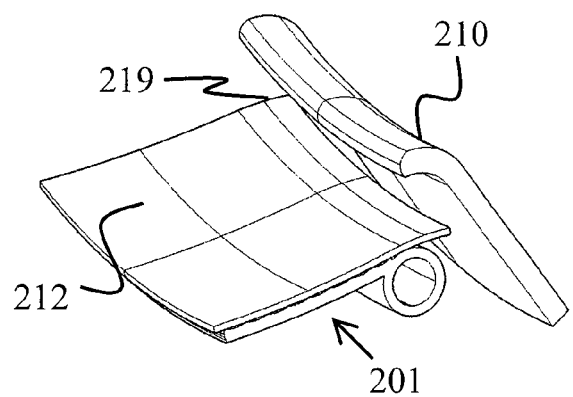
FIG. 42 is a partially cutaway perspective view detailing a section at the edge of a mold with partially shaped glass in place.
Figure 43:
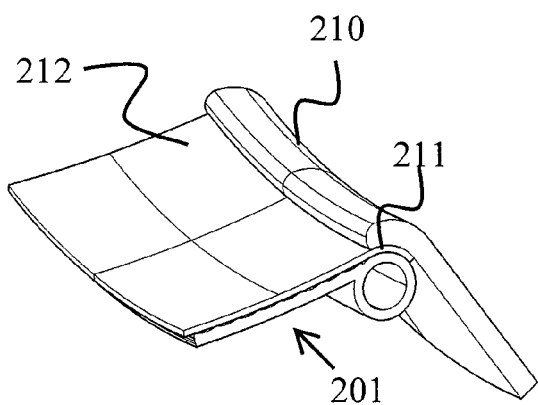
FIG. 43 is a partially cutaway perspective view detailing a section at the edge of a mold with glass in place and formed into a rolled edge by a shaping tool.
Figure 44:
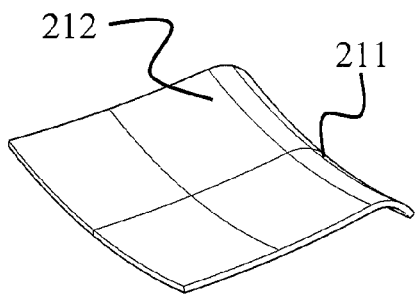
FIG. 44 is a partially cutaway perspective view detailing a section of glass curved and shaped with a rolled edge by the molding process according to the present invention.

The operation of the edge rolling tool 210 is shown in perspective views in the sequence of FIG. 41, FIG. 42, FIG. 43 and FIG. 44. FIG. 41 shows a section cutaway of a mold plate segment 217 with its tube perimeter 203, and a cutaway of the edge shaping tool 210 poised above the mold 201. FIG. 40 and FIG. 42 show a cutout of a slumped glass sheet 212, still hot and soft, with a partially-slumped edge 219 formed by sagging under its own weight. FIG. 43 shows the edge tool 210 making intimate pressing contact with the glass 212 in order to form the rolled edge 211. FIG. 44 shows the finished rolled edge 211 of the glass 212. The specular quality of the rolled glass edge 211 is not important and so the shaping tool may have a conventional, smooth machined finish.

Figure 45:
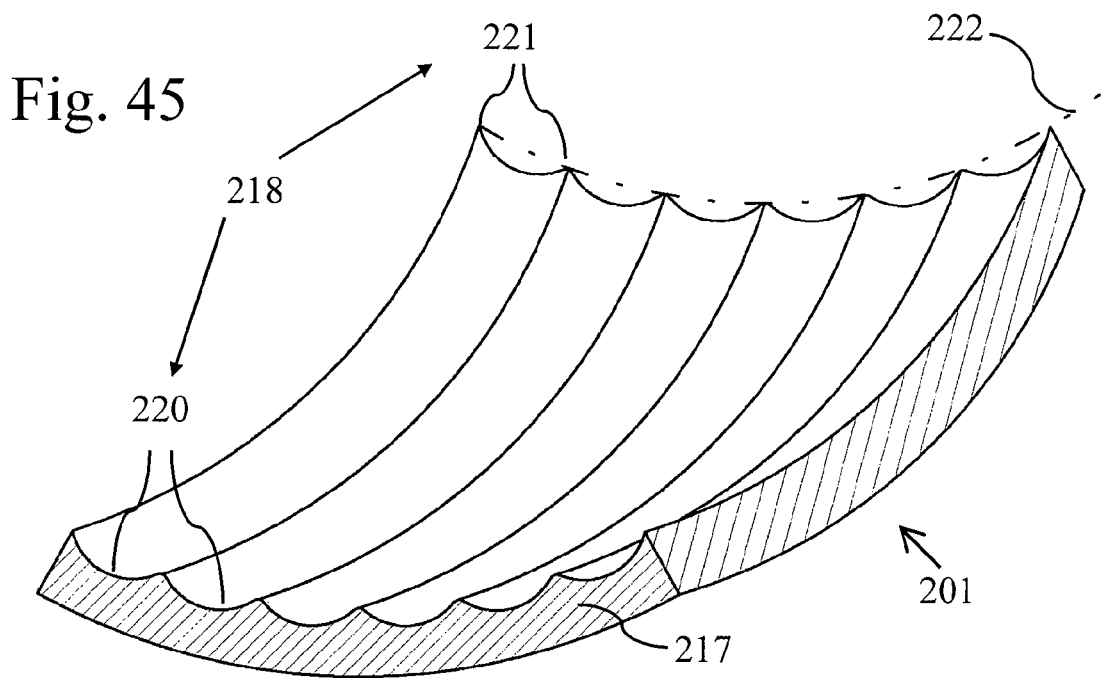
FIG. 45 is a schematic diagram showing a cutaway view of a section of a mold surface with grooves and cusps.
Figure 46:
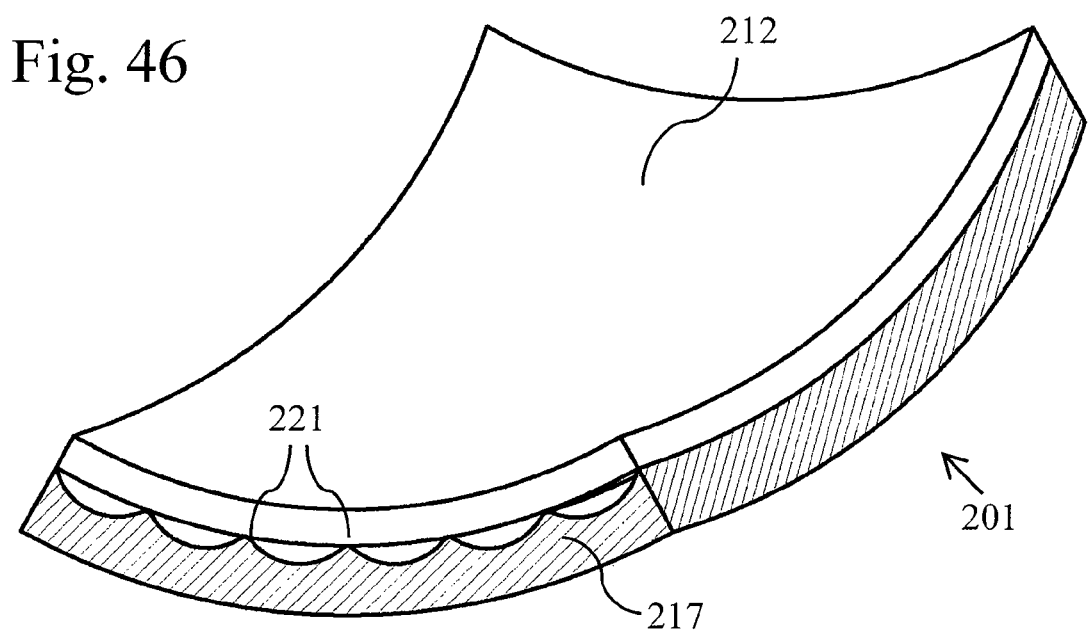
FIG. 46 is a schematic diagram showing a cutaway view of a mold section with shaped glass touching the cusps.

In one preferred implementation, illustrated in FIG. 45, a mold 201 is made with a grooved surface profile 218, in order to minimize damage to the specular back surface of the glass 212 by contact with the mold surface. The surface of the molding plate 217 is final-machined by passes of a ball end mill tool to create adjacent concave grooves 220 that intersect in cusps 221. The cusp surface profile 222 defines the shape that the glass 212 will adopt. Typically the mold 201 will be machined to within +/−10 microns of the local shape of the reflector 1. During shaping, as shown in FIG. 46, the softened glass sheet 212 contacts the line of cusps 221, and bridges between them, taking its overall shape as defined by the surface profile at the peak of the cusps. Since the natural fidelity of replication is excellent, the slumped glass 212 will adopt the shape of the mold 201 on spatial scales larger than the groove spacing, and will preserve the natural smoothness and specular reflection of virgin float glass 200 on smaller scales.

Figure 47:
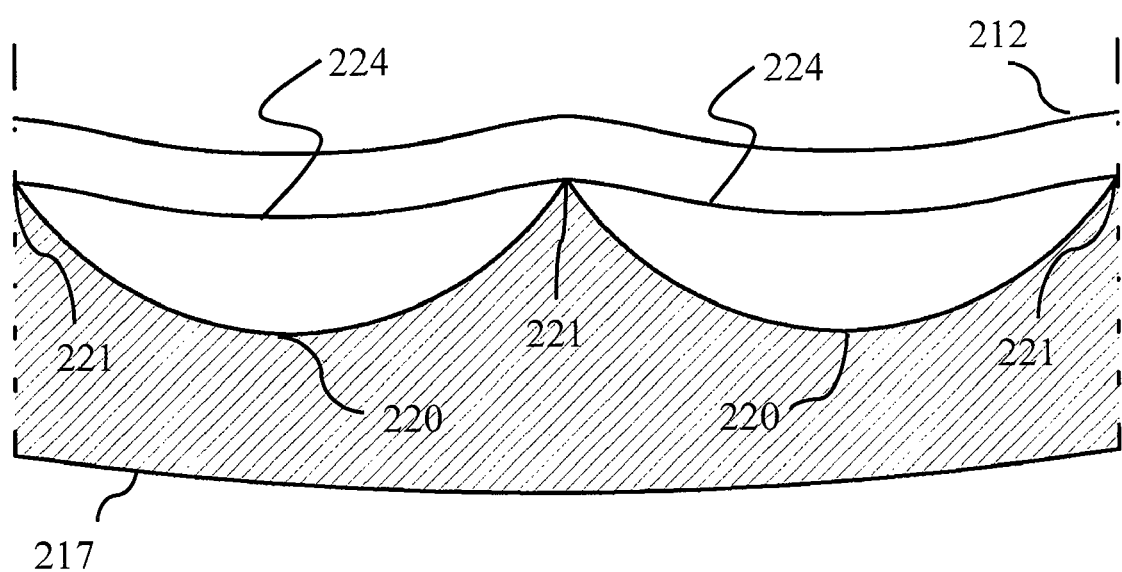
FIG. 47 is a cross sectional view of a cusped mold detailing shaped glass resting on the cusps after completion of shaping.

In detail view of the glass-mold contact, shown in FIG. 47, the glass 212 droops slightly 224 between cusps 221, where the droop depth depends on the contact dwell time and the glass viscosity at the slump temperature. The shaping process is optimized such that the dished shape 212 is largely formed by free stretching and sagging before the glass 212 lightly touches and comes to rest on the cusps of the mold 211. Rapid cooling to prevent continued drooping between the cusps is started as soon as contact is made across the mold 201. In this way, marring of the glass 212 is localized to narrow lines of small dimples along the cusps 221, and wear of the mold 201 is minimized. For this process, the net solar collecting area lost to scatter from contact damage at cusps 221 and surface slope errors from resulting dimples in the glass 212 is found to average no more than 0.25% of the total glass surface area, and in practice the slope angles for drooping between grooves 221 having a spacing in the range of one to three centimeters are typically less than 0.1 degrees rms.

A further advantage of the cusped mold surface 218 of this invention is that direct thermal conduction from the mold 201 to the glass 212 during the thermal cycle of shaping is minimized, because the area of contact line 221 is so small. Minimal heating of the mold 201 insures that shape warpage caused by temperature gradients is minimized. Another advantage is that the concave valleys 220 also provide regions 220 that gather small particulate contamination, keeping small particles sub-flush to the cusp 221 during slump and thereby reducing dimples in the glass 212 that might otherwise have been caused by protruding particles on the surface 220 of the mold 201.

In a second preferred alternative to minimize contact damage, cushions of air are used to prevent any direct contact between the glass 212 and the mold 201. A preferred implementation has a double manifold below the mold surface. One manifold is pressurized while the other manifold is evacuated. The pressurized manifold supplies air to the air cushions, while the evacuated manifold carries away the pressurizing air and ensures overall downward pressure. In this alternative embodiment, the cushions are spaced by one to four centimeters, with evacuating holes between.

Heat transfer to the slump mold 201 is preferably minimized during the glass shaping thermal cycle, to minimize thermal cycling and to hold the temperature on the mold 201 well below the critical oxide-scale limit of 800 C for temperature-cycling of AISI 304 stainless steel. The internal temperature gradient within molding plate segments and across the mold 201 will preferably be minimized to reduce warpage tendency, so as to replicate glass 212 having a proper and consistent shape. The mold 201 is preferably coated for high reflectivity to the thermal radiation transmitted and emitted by the glass 212, in order to minimize absorption. Residual bowing of the mold faceplates or facesheet is restrained by fasteners located across the rigid framework. After a glass sheet 200 has been shaped into the desired dish configuration 212, the mold face will be brought into thermal equilibrium and restored to the preferred starting temperature by forced air convection before being used to shape the next sheet of glass 200. The underlying structure remains effectively a thermal and undergoes no significant thermal distortion during the small radiation exposure of shaping.

A preferred method for increasing mold reflectivity is to coat the surface with 10-50 microns of an abrasion resistant, highly reflective, uniformly thick, and tenacious dense metallic film that maintains high reflectivity after several months of use at temperatures up to 400 C. Coating methods such as electrolytic or electroless plating, sputtering, plasma and thermal spraying, vapor deposition and combinations of these methods are preferred. Preferred plating metals include chromium, nickel and noble metals such gold, platinum, rhodium and their refractory alloys such as nickel-chromium, nickel-doped phosphorous, platinum-rhodium, and platinum-iridium.

Figure 48:
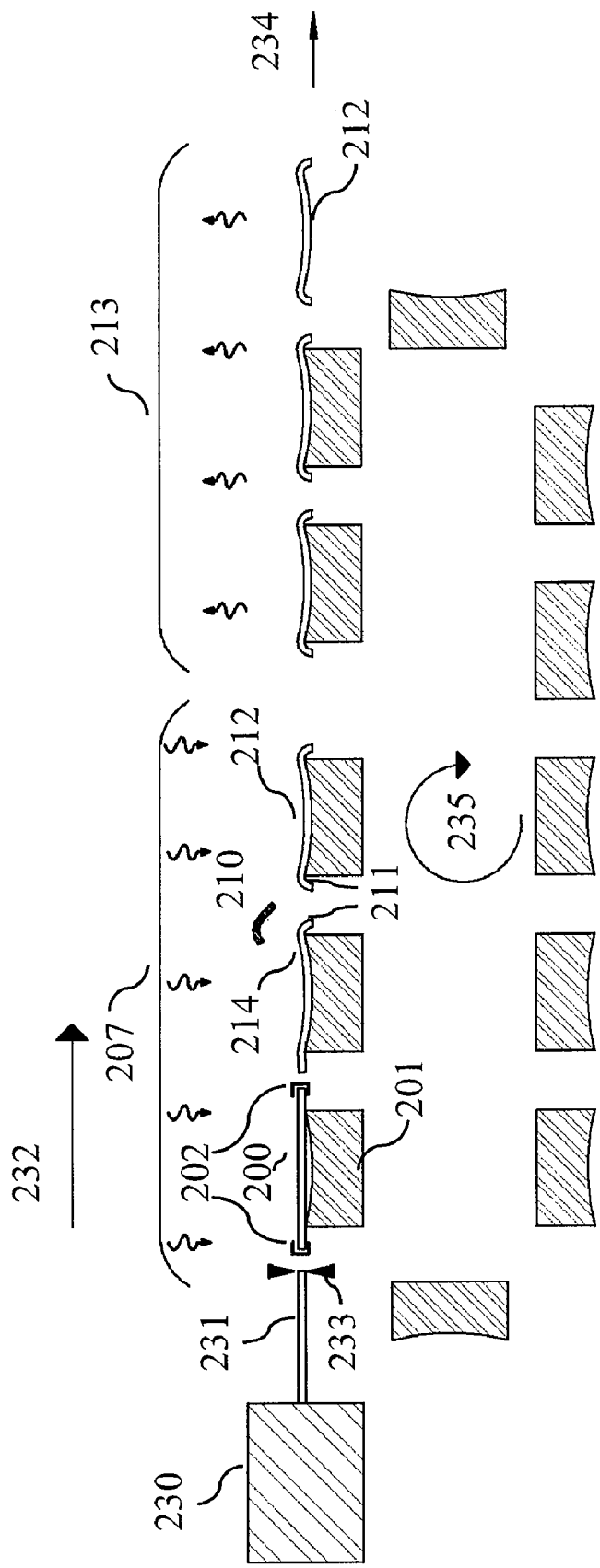
FIG. 48 is a schematic diagram illustrating a plurality of molds for shaping glass reflectors in a production line adapted to manufacture glass reflectors at a rate corresponding to the rate of output of a float glass production line.

In order to supply very large numbers of glass reflectors 1 at lowest possible cost, the glass shaping described above and a back-silvering process will preferably be incorporated into a float glass factory, whose entire glass output will be in the form of solar reflectors 1. An automated continuous process according to this invention, to provide for shaping process at the speed required for integration into a float glass factory, is shown schematically in FIG. 48. Float glass 231 is drawn from the melting furnace and tin float bath 230 where the glass emerges as a ribbon 231 at approximately 600 C onto a conveyor system 232. Here the float glass 231 is cut into square sheets 200 while still hot. One preferred method to cut hot glass 231 into sheets 200 before the shaping step in the production line is by scoring and breaking, which is the oldest and least expensive of all cutting methods. This requires the glass 231 to be cooled either globally or locally in the region to be cut to its brittle temperature range, below approximately 350 C. An alternative preferred method, which avoids the need to cool glass 231 just to cut it, is laser cutting. Suitable high energy laser systems for high-speed cutting of a hot glass ribbon 231 are disclosed in U.S. Pat. No. 3,885,943, to Chui, in U.S. Pat. No. 3,930,825, to Chui, and in U.S. Pat. No. 3,934,995, to French, all of which are incorporated herein by reference.

The substantially flat cut sheets 200, cut from glass ribbon 231 using a cutting apparatus 233 (for example laser cutting device or scoring and breaking device), are cooled to a stiffness that allows handling from corners by corner clamps 202. Once gripped by the clamps 202, the sheet 200 is positioned above a slump mold 201. The mold 201 and sheet 200 then enter the shaping tunnel 207 where intense radiant energy from an extended blackbody at temperatures in the range of 800 C to 1200 C strikes the top surface of the glass 200 and rapidly boosts it to sagging temperature resulting in a sagging glass sheet 214. Shaping of the hot glass by the steps already described above takes place within the hot tunnel. Sagging, stretching and molding of the glass to shape 212 is accomplished quickly by gravity, accelerated if desired by application of pressure. Edge-shaping tools 210 form the rolled edges 211, including at the corners after removal of the sheet's corner clamps 202. After shaping is complete, the glass 212 enters a cooling tunnel 213, where it is quickly cooled by both convection and radiating heat away to a cold surface that absorbs radiation. When cooled enough to recover sufficient rigidity to hold its shape, the formed glass 212 is removed from its mold 201 and transferred to the conveyor line 213, which moves the glass 212 along for annealing and cooling. Molds 201 are cycled 235 and re-introduced to the production line.

At the far downstream end of the production line 234, silver is applied, preferably by vacuum plasma assisted processes similar to that used to deposit silver and dielectric layers on float glass in the manufacture of low E architectural windows. Following conventional mirror fabrication practice, the silver surface and leading edges of the glass 212 are over-coated with a copper film oxidation barrier, also preferably by plasma deposition. Finally, the copper film and mirror edges are powder-coated with a weather-resistant polymer seal. The finished glass reflectors 1 are stackable, and may be stacked and shipped for integration with trackers 107 and energy converters 4, and for installation at solar farm sites.

In an alternative embodiment of the float glass, the glass ribbon 231, after being cut by the cutting apparatus 233, is fed into two or more shaping lines, to ensure continual production if one production line suffers breakdown or is slowed in its operation. In addition, a separate branch may be provided to cool and package flat glass sheets 200 in case all shaping lines break down. Glass sheets 200 may be stored for shaping offline.

The number of molds 201 and the length of the production line needed to support continuous production at the full rate of output available from a float glass factory, depend on the cycle time for each mold 201. For example, in a process where this cycle time is two hundred seconds and a new sheet 200 to be processed emerges from the tin float bath 230 every ten seconds, then twenty molds 201 must be in use at once. The manufacturing process of this invention is designed to minimize the mold cycle time, and thus minimize the number of molds 201 in use on the production line and the size of the facility. The mold cycle time is set largely by thermal equilibration and heat transfer factors. For example, thermal equilibration and heat transfer times involved in heating and softening the glass 214, and the time required for stretching and thermal equilibration and cooling down to make the glass 212 rigid so it can be released from the mold 201, will be factors affecting mold cycle time.

The temperature to be reached for shaping glass sheets 200 is determined by the need to accomplish sagging and stretching in a relatively short time. To determine the speed of glass stretching into the dish shape 212 under gravity, the gravitational potential energy lost with sagging is equated with that dissipated by stretching the viscous glass. For example, for a square sheet 200 clamped at its corners 202 and sagging under its own weight by membrane-type stretching of the glass, we show that the saggital depth "s" at the center increases with the cube root of time "t" and viscosity "η" approximately as $$s = (cg\rho x^4 t/\eta)^{1/3} \qquad (1)$$

where "c" is a numerical constant (approximately 0.044), "g" is the acceleration due to gravity, "ρ" is the glass density, "x" is the average span length between mold supports, and "η" is the shear viscosity. The shear viscosity of typical commercial soda-lime glass in the temperature range 500-750 C varies with absolute temperature T as $\eta = \eta_o \exp(B/T)$, where $\eta_o = 1.6 \times 10^{-18}$ poise and $B = 5.8 \times 10^4$ K. For the preferred shaping temperature range between 650 C and 750 C, the viscosity drops from $4.3 \times 10^9$ poise (650 C) to $9 \times 10^6$ poise (750 C).

As a specific dimensioned example of a preferred reflector 3.1 m square, the time to sag to a preferred depth s=0.795 m at the center from the above equation is approximately 20 sec at 710 C, and varies by a factor of two for each ten degree change of temperature. Thus the upper temperature for the process will be in the region of 710 C. At the other extreme, the distortion on handling for one minute is reduced to a negligible level at temperatures less than 500 C.

In the process described in this invention, heating and cooling between these temperatures is accomplished in large measure by radiation transfer. For heating, radiation from a substantially continuous blackbody at 800-1200 C is preferred, since the thermal radiation at these temperatures is largely absorbed by the glass. Thus a 4 mm thick glass sheet 200 may be heated from room temperature to an average temperature of 710 C in fifty seconds by radiation on one side from a 900 C blackbody, and in twenty seconds from a 1200 C blackbody. If the glass 200 is hotter at the start of heating, less time is needed.

After rapid radiative heating, the glass 214 is much hotter and thus less viscous on the heated side. The time constant for equilibration by conduction across a sheet of soda-lime glass is approximately nineteen seconds for 3 mm thickness, thirty-four seconds for 4 mm, and fifty-three seconds for 5 mm. Some degree of equilibration is preferred as the glass 212 takes up the mold shape and the edges 211 are rolled. When shaping is complete, the glass 212 will be cooled from about 710 C to about 500 C by radiation into a cool absorbing surface 213, taking about fifty seconds for a 4 mm sheet, and followed by around thirty seconds for equilibration at 500 C before removal.

A mold cycle for shaping 4 mm thick glass according to the above operations taken in sequence may for example include fifty seconds for heating by 900 C radiation, twenty seconds for sagging, thirty seconds for equilibration, settling on the mold and edge shaping, fifty seconds for radiative cooling, thirty seconds for equilibration before removal, and sixty seconds to return the mold 201 for reloading, for a total of 240 seconds. For a ten second glass cycle time, twenty-four molds are in use at once, and the thermal processing part, hot shaping and cooling, will take 180 seconds. For a mold-to-mold separation of four meters, and thus a line speed of 0.4 m/sec, the shaping line length will be around seventy-two meters.

During the development of the above high volume process, glass reflectors 1 may be manufactured off-line at a slower rate from stacked cold glass sheets 200. The initial stages are different, and require the cold glass sheets 200 to be handled safely and brought to the slump mold 201 without breakage. The cold sheets 200 are picked from a vertical stack with a multi-cup vacuum-lift fixture that holds the glass 200 everywhere flat within a few mm and in a low-stress state. The sheet 200 will then be turned horizontal, and gripped from the corners using corner grips 202 on a handling frame. The vacuum handling fixture is released to unload the sheet 200 and the glass relaxes slightly in its gripped state. The sheet loading procedure and non-translating corner grips 202 keep the maximum tensile stress below the 3.5 MPa safety limit.

Glass sheets 200 that are loaded in this manner into handling frames will be conveyed through a conventional pre-heating tunnel to a peak temperature of approximately 500 C. From there on, a glass sheet 200 using its handling frames is mated with a shaping mold 201 as in FIG. 26 and the process continues as previously described.

Those skilled in the art, after having the benefit of this disclosure, will appreciate that modifications and changes may be made to the embodiments described herein. Changes may be made in the steps of the manufacturing process, additional steps may be added, different materials may be substituted, and equivalent features used, all without departing from the scope and spirit of the invention. This disclosure has set forth certain presently preferred embodiments and examples only, and no attempt has been made to describe every variation and embodiment that is encompassed within the scope of the present invention. The scope of the invention is therefore defined by the claims appended hereto, and is not limited to the specific examples set forth in the above description.

What is claimed is:

1. A method of manufacturing a glass reflector for use in a solar energy system, comprising the steps of:
   heating and softening a sheet of float glass positioned over a mold that has cusped grooves in an operative surface of the mold corresponding to the sheet of glass, wherein said mold has cusps;
   molding the float glass sheet into a curved dish shape substantially conforming to said cusps by sagging and stretching the glass sheet;
   rolling the edges of the float glass, while the sheet is still soft and the concave dish is being shaped, in order to create a structural reinforcement lip around the periphery of the dish-shaped float glass; and,
   creating a reflective surface on the dish-shaped float glass.

2. The method of manufacturing glass reflectors according to claim 1, wherein:
   said heating step comprises radiative heating.

3. The method of manufacturing glass reflectors according to claim 2, wherein:
   the method further comprises restraining corners of said sheet.

4. The method of manufacturing glass reflectors according to claim 2, further comprising the step of:
   cooling the glass sheet by rapid radiative cooling.

5. The method of manufacturing glass reflectors according to claim 1, wherein:
   the operative mold surface proximate to the piece of glass that is being molded is reflective to heat radiation fluxes during heating.

6. The method of manufacturing glass reflectors according to claim 5, wherein:
   the method further comprises restraining corners of said sheet.

7. The method of manufacturing glass reflectors according to claim 5, further comprising the step of:
   cooling the glass sheet by rapid radiative cooling.

8. The method of manufacturing glass reflectors according to claim 1, further comprising the step of:
   coating a surface of the glass with a reflective coating.

9. The method of manufacturing glass reflectors according to claim 1, further comprising the step of:
   coating a back surface of the glass with a reflective coating.

* * * * *